United States Patent
Shiraishi et al.

(10) Patent No.: US 9,082,814 B2
(45) Date of Patent: Jul. 14, 2015

(54) SEMICONDUCTOR DEVICES AND POWER CONVERSION SYSTEMS

(75) Inventors: Masaki Shiraishi, Hitachinaka (JP); Mutsuhiro Mori, Mito (JP); Hiroshi Suzuki, Hitachi (JP); So Watanabe, Mito (JP)

(73) Assignee: Hitachi Power Semiconductor Device, Ltd., Hitachi-shi (JP)

( * ) Notice: Subject to any disclaimer, the term of this patent is extended or adjusted under 35 U.S.C. 154(b) by 705 days.

(21) Appl. No.: 13/348,021

(22) Filed: Jan. 11, 2012

(65) Prior Publication Data

US 2012/0176828 A1    Jul. 12, 2012

(30) Foreign Application Priority Data

Jan. 12, 2011 (JP) ................................ 2011-003845

(51) Int. Cl.

| | |
|---|---|
| H01L 29/40 | (2006.01) |
| H01L 29/423 | (2006.01) |
| H01L 29/66 | (2006.01) |
| H01L 29/739 | (2006.01) |
| H01L 29/06 | (2006.01) |
| H01L 29/10 | (2006.01) |

(52) U.S. Cl.
CPC ........ *H01L 29/7397* (2013.01); *H01L 29/0661* (2013.01); *H01L 29/0696* (2013.01); *H01L 29/1095* (2013.01); *H01L 29/402* (2013.01); *H01L 29/4238* (2013.01); *H01L 29/6634* (2013.01); *H01L 2924/0002* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,554,862 | A * | 9/1996 | Omura et al. ................. | 257/137 |
| 5,793,065 | A * | 8/1998 | Shinohe et al. ............... | 257/147 |
| 5,838,026 | A * | 11/1998 | Kitagawa et al. ............. | 257/139 |
| 6,809,349 | B2 | 10/2004 | Yamaguchi et al. | |
| 7,170,106 | B2 * | 1/2007 | Yamaguchi et al. .......... | 257/133 |

(Continued)

FOREIGN PATENT DOCUMENTS

| | | |
|---|---|---|
| CN | 101840919 A | 9/2010 |
| CN | 101847603 A | 9/2010 |

(Continued)

OTHER PUBLICATIONS

Chinese Office Action dated Jan. 3, 2014 (Seven (7) pages).

(Continued)

*Primary Examiner* — Matthew W Such
*Assistant Examiner* — Ali Naraghi
(74) *Attorney, Agent, or Firm* — Crowell & Moring LLP

(57) ABSTRACT

A semiconductor device includes first semiconductor layer of a first conductivity type; a second semiconductor layer of a second conductivity type that is formed near a surface of the first semiconductor layer; a first main electrode that is electrically connected to the second semiconductor layer; a third semiconductor layer of the second conductivity type that neighbors the first semiconductor layer; a fourth semiconductor layer of the first conductivity type that is selectively disposed in an upper portion of the third semiconductor layer; a second main electrode that is electrically connected to the third semiconductor layer and the fourth semiconductor layer; a trench whose side face is in contact with the third semiconductor layer and the fourth semiconductor layer; a gate electrode that is formed along the side face of the trench by a sidewall of polysilicon; and a polysilicon electrode.

30 Claims, 16 Drawing Sheets

(56) References Cited

U.S. PATENT DOCUMENTS

| | | | |
|---|---|---|---|
| 7,180,106 B2 | 2/2007 | Hatade et al. | |
| 7,557,406 B2 | 7/2009 | Parthasarathy et al. | |
| 7,948,005 B2 * | 5/2011 | Mori et al. | 257/133 |
| 8,334,480 B2 * | 12/2012 | Yeung | 219/201 |
| 2003/0160270 A1 * | 8/2003 | Pfirsch et al. | 257/288 |
| 2006/0017078 A1 | 1/2006 | Thapar | |
| 2007/0001263 A1 * | 1/2007 | Nakagawa | 257/565 |
| 2007/0210356 A1 | 9/2007 | Henson | |
| 2008/0185629 A1 * | 8/2008 | Nakano et al. | 257/316 |
| 2009/0291520 A1 * | 11/2009 | Yoshikawa | 438/55 |
| 2010/0084706 A1 | 4/2010 | Kocon | |
| 2010/0155773 A1 | 6/2010 | Parthasarathy et al. | |
| 2011/0133718 A1 | 6/2011 | Watanabe et al. | |

FOREIGN PATENT DOCUMENTS

| | | |
|---|---|---|
| JP | 2001-217419 A | 8/2001 |
| JP | 2004-39838 A | 2/2004 |
| JP | 2004-153112 A | 5/2004 |
| JP | 2005-327806 A | 11/2005 |
| JP | 2007-43123 A | 2/2007 |
| JP | 2007-266133 A | 10/2007 |
| JP | 2008-205461 A | 9/2008 |
| JP | 2008-288386 A | 11/2008 |
| JP | 2009-194044 A | 8/2009 |
| JP | 2011-119416 A | 6/2011 |
| JP | 2011-176249 A | 9/2011 |
| WO | WO 02/082553 A1 | 10/2002 |

OTHER PUBLICATIONS

Japanese Office Action dated Mar. 11, 2014 with English translation (ten (10) pages).

* cited by examiner

Second embodiment

Third embodiment

Fourth embodiment

Sixth embodiment

Seventh embodiment

SEMICONDUCTOR DEVICES AND POWER CONVERSION SYSTEMS

CROSS REFERENCE TO RELATED APPLICATIONS

This application claims the foreign priority benefit under Title 35, United States Code, §119(a)-(d) of Japanese Patent Application No. 2011-003845, filed on Jan. 12, 2011, the contents of which are hereby incorporated by reference.

TECHNICAL FIELD

The present invention relates to a semiconductor device and a power conversion system using the semiconductor device.

BACKGROUND ART

A semiconductor device may function as a switching element that controls a current flowing between main electrodes by a voltage applied to a control electrode. An insulated gate bipolar transistor (hereinafter, referred to as IGBT), which is one kind of this semiconductor device having a trench insulated gate structure, can control a current flowing between a collector electrode and an emitter electrode by a voltage applied to a gate electrode. Since IGBT can control electric power ranging from dozens of watts to hundreds of thousands of watts and a wide switching frequency ranging from dozens of Hz to beyond hundreds of KHz, IGBT is widely used for power conversion systems from a small power application (for example, inverter, converter, chopper) to a large power application for railway, ironworks and the like.

IGBT is required to reduce the loss for increasing efficiency of the power conversion systems, that is, required to reduce the conduction loss and the switching loss. In addition, in order to avoid, for example, electromagnetic compatibility noises (hereinafter, referred to as EMC noises), malfunctions and breakdown of a motor, a capability of dV/dt control during the turn-off switching period by a control of a gate drive circuit is required depending on specifications of the application.

Then, Patent Document 1 of Japanese Patent Publication No. 2004-39838 proposes a method that improves a controllability of dV/dt by electrically connecting a floating p-layer to the emitter electrode through a resistance. In addition, Patent Document 2 of Japanese Patent Publication No. 2005-327806 proposes a structure that can reduce a switching loss by increasing the switching speed by increasing a ratio of gate-emitter capacity to gate-collector capacity by forming a trench instead of the floating p-layer of Patent Document 1 and filling the trench with an insulator film or a semiconductor layer.

PRIOR ART DOCUMENT

Patent Document

[Patent Document 1] Japanese Patent Publication No. 2004-39838
[Patent Document 2] Japanese Patent Publication No. 2005-327806

SUMMARY OF THE INVENTION

Problems to be Solved by the Invention

In the case of Patent Document 1, the controllability of dV/dt increases as a resistance between the floating p-layer and the emitter electrode decreases. However, since a part of hole current injected into the floating p-layer in on-state flows out to the emitter electrode through the resistance, a stimulating effect of electron injection becomes weak and the ON-voltage increases, as a result, the loss increases. On the other hand, if the resistance is increased, an increase in the ON-voltage becomes small. However, the controllability of dV/dt decreases. As described above, in Patent Document 1, it was considered that there is a trade-off relation between improvement of the controllability of dV/dt and reduction of the loss.

In addition, in the case of patent Document 2, it was considered that an electric field concentrates at a corner of the gate electrode on the side of the insulator film which is filled in the trench, and as a result, the breakdown voltage decreases.

It is, therefore, an object of the present invention to provide a semiconductor device that can improve a controllability of dV/dt during the turn-off switching period by a gate drive circuit, while maintaining a low loss and a high breakdown voltage, and a power conversion system using the semiconductor device.

Means for Solving the Problems

In order to solve the foregoing problems, according to the present invention, there is provided a semiconductor device which includes: a first semiconductor layer of a first conductivity type; a second semiconductor layer of a second conductivity type that is formed near a surface of the first semiconductor layer; a first main electrode that is electrically connected to the second semiconductor layer; a third semiconductor layer of the second conductivity type that neighbors the first semiconductor layer and is formed near a surface of the first semiconductor layer opposite to the second semiconductor layer; a fourth semiconductor layer of the first conductivity type that is selectively disposed in an upper portion of the third semiconductor layer; a second main electrode that is electrically connected to the third semiconductor layer and the fourth semiconductor layer; a trench whose side face is in contact with the third semiconductor layer and the fourth semiconductor layer, while reaching the first semiconductor layer; a gate electrode that is formed by a sidewall of polysilicon along the side face of the trench; and a polysilicon electrode that is disposed away from the gate electrode within the trench and electrically connected to the second main electrode.

In addition, according to the present invention, there is provided a power conversion system using the semiconductor device.

Effects of the Invention

According to the present invention, there is provided a semiconductor device that can improve a controllability of dV/dt during the turn-off switching period by a gate drive circuit, while maintaining a low loss and a high breakdown voltage, and a power conversion system using the semiconductor device.

EMBODIMENT OF THE INVENTION

Next, explanations will be given of embodiments according to the present invention in detail in reference to drawings as appropriate. Meanwhile, in each drawing, a common part is given the same reference and a duplicated explanation will be omitted.

First Embodiment (Structure of Semiconductor Device)

Figure 1:
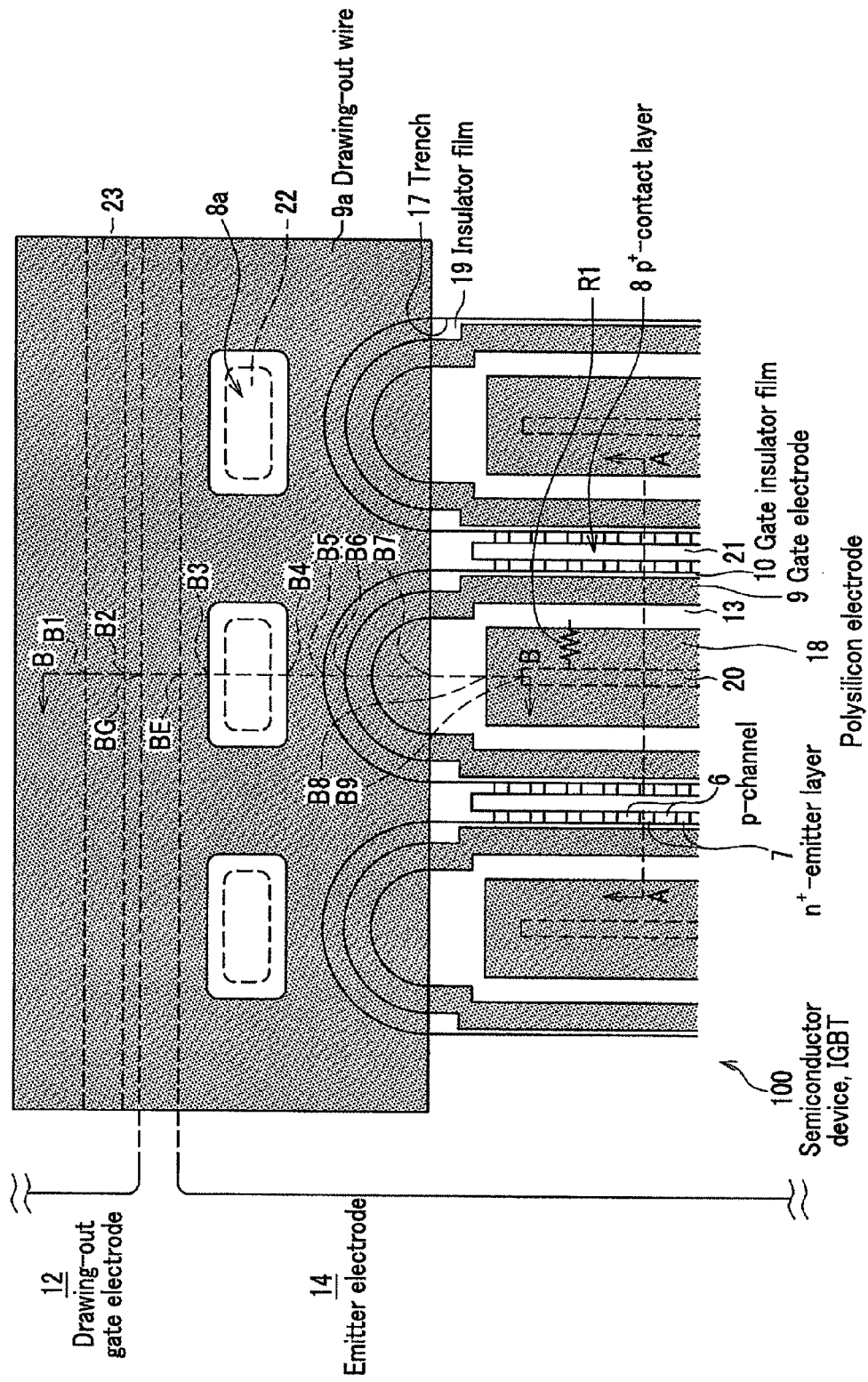
FIG. 1 is a plan view of a main portion of a semiconductor device (IGBT) according to a first embodiment of the present invention.

A plan view of a main portion of a semiconductor device (IGBT) 100 according to the first embodiment of the present invention is shown in FIG. 1. In FIG. 1, specifically, a gate electrode 9, a drawing-out wire 9a for drawing out the gate electrode 9 outside and a polysilicon electrode 18 are drawn transparently. In the embodiment, the foregoing elements are all formed of the same polysilicon layer through patterning. A plurality (six in FIG. 1) of gate electrodes 9 are disposed. Two gate electrodes 9 form a pair and are connected so as to form a semicircular shape at each end portion and fold back. Each of the two gate electrodes 9 is connected to the drawing-out wire 9a at the end portion. The two gate electrodes 9 that form the pair including the semicircular shape that folds back at respective end portions are disposed inside a trench (groove) 17. An end portion (terminal structure) of the trench 17 is also formed in a semicircular shape, and an outer shape of the trench 17 has a finger-like shape of human being. An insulator film (first insulator film) 19 is disposed along a sidewall of end portion (terminal structure) of the semicircular trench 17. In addition, a gate insulator film (second insulator film) 10 is disposed on the sidewall of the trench 17 away from the terminal structure. A thickness of the insulator film (first insulator film) 19 is thicker than the thickness of the gate insulator film 10. No corner portion is formed by forming the terminal structure of the trench 17 in substantially a semicircular shape so that the insulator film 19 (gate insulator film 10) is prevented from becoming thin at the corner portion. In addition, the insulator film 19 which is thicker than the gate insulator 10 is disposed near the terminal structure of the trench 17. Therefore, in the terminal structure of the trench 17, a breakdown voltage (gate breakdown voltage) of the gate electrode 9, which is drawn up outside from inside of the trench 17 and connected to the drawing-out wire 9a, is improved.

A groove-like contact hole 23 is disposed on the drawing-out wire 9a along a plurality of terminal structures of the trench 17. The drawing-out wire 9a is connected to a drawing-out gate electrode 12 through the contact hole 23.

A contact hole (second contact hole) 22 is surrounded by the drawing-out wire 9a which draws out the gate electrode 9 outside the trench 17. The contact hole (second contact hole) 22 is disposed further outside of the terminal structure with respect to the trench 17. A $p^+$-contact layer 8a is formed on the bottom of the contact hole (second contact hole) 22. The contact hole (second contact hole) 22 connects an emitter electrode 14 to the $p^+$-contact layer 8a and further to a p-well layer (fifth semiconductor layer) 25 (see FIG. 2B).

An interlayer dielectric film 13 is disposed between two gate electrodes 9 that form a pair and fold back in the semicircular shape at respective end portions along the gate electrode 9, and a polysilicon electrode 18 is disposed between the interlayer dielectric films 13. The polysilicon electrode 18 is disposed inside the trench 17. A groove-like contact hole 20 is disposed on the polysilicon electrode 18 in parallel with a sidewall of the trench 17. The polysilicon electrode 18 is connected to the emitter electrode 14 through the contact hole 20.

A plurality (three in FIG. 1) of trenches 17 are disposed and arranged in parallel to each other. A groove-like contact hole 21 is disposed between neighboring trenches 17 in parallel with the sidewall of the trench 17. A $p^+$-contact layer 8, an $n^+$ (first conductivity type)-emitter layer (fourth semiconductor layer) 7 and a p (second conductivity type)-channel layer (third semiconductor layer) 6 are formed on the bottom and around the bottom of the contact hole 21. The $p^+$-contact layer 8, the $n^+$-emitter layer (fourth semiconductor layer) 7 and the p-channel layer (third semiconductor layer) 6 are connected to the emitter electrode 14 through the contact hole 21. The $n^+$-emitter layer (fourth semiconductor layer) 7 and the p-channel layer (third semiconductor layer) 6 are alternately and repeatedly disposed along the sidewall of the trench 17.

Figure 2A:
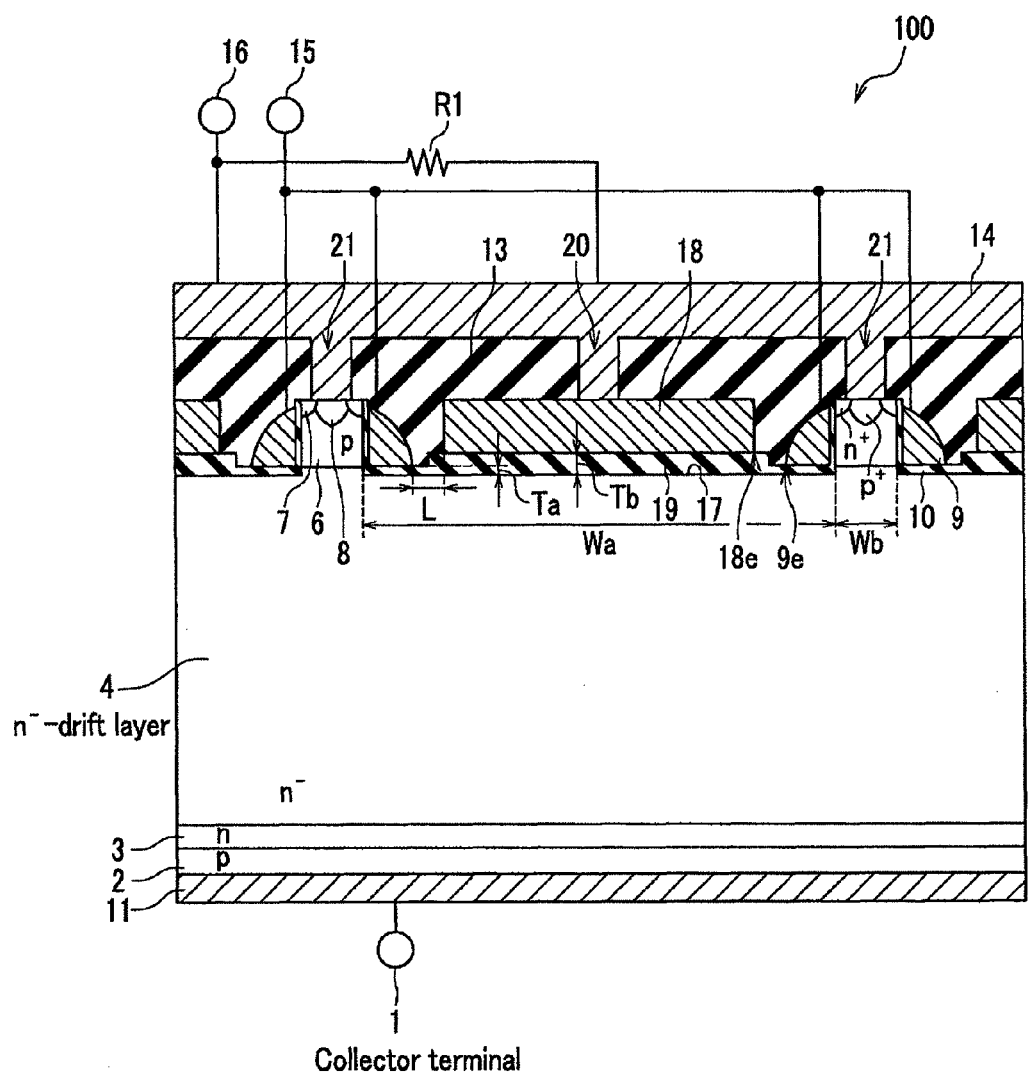
FIG. 2A is a cross sectional view taken along A-A line of FIG. 1.

A cross sectional view of FIG. 1 taken along A-A line is shown in FIG. 2A. The IGBT 100 according to the present invention includes a collector electrode (first main electrode) 11, a p-collector layer (second semiconductor layer) 2, a n-buffer layer 3, a $n^-$-drift layer (first semiconductor layer) 4, a p-channel layer (third semiconductor layer) 6, a $n^+$-emitter layer (fourth semiconductor layer) 7, a $p^+$-contact layer 8, a trench 17, a gate electrode 9, a gate insulator film (second insulator film) 10, an insulator film (first insulator film) 19 inside the trench 17, a polysilicon electrode 18 disposed between the gate electrodes 9 inside the trench 17, an interlayer dielectric film 13, an emitter electrode (second main electrode) 14, a collector terminal 1, an emitter terminal 16 and a gate terminal 15. Meanwhile, a layer that is put "n" or "p" means an n-type layer that has electrons as a majority carrier and a p-type layer that has holes as a majority carrier, respectively. A superscript "−" or "+" for "n" or "p" means a relatively low majority carrier concentration (impurity concentration) or a relatively high majority carrier concentration (impurity concentration) of the layer. For example, the first conductivity type corresponds to n-type and the second conductivity type corresponds to p-type. If the first conductivity type is n-type, then, the second conductivity type is p-type. On the other hand, if the first conductivity type is p-type, then, the second conductivity type corresponds to n-type.

The IGBT 100 according to the present invention shown in FIG. 2A is an n-channel IGBT. The n-buffer layer 3, the p-collector layer 2 and the collector electrode 11 are stacked near a surface of backside of the $n^-$-drift layer 4. The collector electrode 11 is electrically connected to the p-collector layer 2. The collector terminal 1 is connected to the collector electrode 11.

The p-channel layer 6 adjacent to the $n^-$-drift layer 4 is formed near a surface of front side of the $n^-$-drift layer 4. The $n^+$-emitter layer 7 is selectively disposed in an upper portion of the p-channel layer (therefore, as shown in FIG. 1, the $n^+$-emitter layer 7 and the p-channel layer 6 are alternately arranged along the sidewall of the trench 17). The emitter electrode 14 is electrically connected to the p-channel layer 6 though the $p^+$-contact layer 8, and also electrically connected to the $n^+$-emitter layer 7.

The sidewall of the trench 17 is in contact with the $n^+$-emitter layer 7 and the p-channel layer 6. A bottom surface of the trench 17 is deeper than those of the $n^+$-emitter layer 7 and the p-channel layer 6, and reaches the $n^-$-drift layer 4. The gate insulator film 10, the gate electrode 9, the insulator film 19 and the polysilicon electrode 18 are disposed inside the trench (groove) 17. The gate insulator film 10 is disposed on the side face of the trench 17 and on a periphery portion of the bottom surface of the trench 17. The gate electrode 9 is disposed on the gate insulator film 10 along the side face of the trench 17. The insulator film 19 is disposed in the center portion on the bottom surface of the trench 17. The polysilicon electrode 18 is disposed on the insulator film 19. The polysilicon electrode 18 is disposed at a distance L (a distance between gate electrode and polysilicon electrode) away from the gate electrode 9. The polysilicon electrode 18 is electrically connected to the emitter electrode 14.

A height of an upper surface of the polysilicon 18 is substantially equal to a height of an upper surface of the p-channel layer 6 ($p^+$-contact layer 8) or $n^+$-emitter layer 7. Therefore, a depth of the contact hole 21 that opens above the p-channel layer 6 and the $n^+$-emitter layer 7 can be made equal to a depth of the contact hole 20 that opens above the polysilicon electrode 18, and as a result, the emitter electrode 14 can be surely connected to the polysilicon electrode 18, the p-channel layer 6 and the $n^+$-emitter layer 7 through the contact holes 20, 21.

The polysilicon electrode 18 is widely formed inside the wide trench 17. However, since the contact hole 20 formed on the polysilicon electrode 18 is formed at the center of the polysilicon electrode 18, an internal resistance is generated within the polysilicon electrode 18. An equivalent circuit of the internal resistance is denoted by a resistance R1.

Figure 2B:
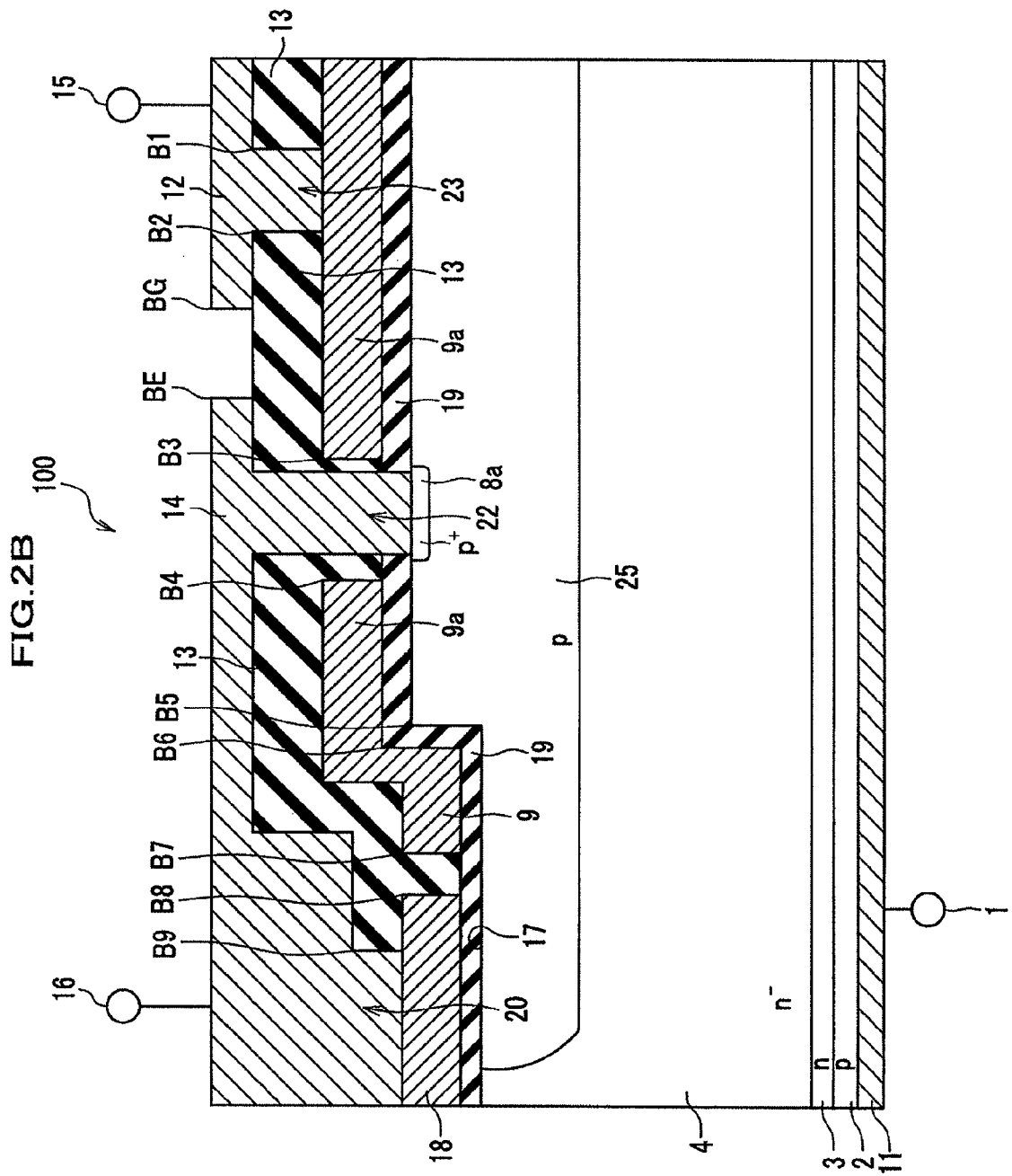
FIG. 2B is a cross sectional view taken along B-B line of FIG. 1.

A cross sectional view of FIG. 1 taken along B-B line is shown in FIG. 2B. Meanwhile, for easy understanding of correspondence between FIG. 2B and FIG. 1, the references B1 to B9, BG and BE of FIG. 1 are shown in FIG. 2B at positions corresponding to B1 to B9, BG and BE on B-B line of FIG. 1, using the same references.

As shown in FIG. 2B, a p-well layer (fifth semiconductor layer) 25 is disposed from a vicinity of end portion (terminal structure) of the trench 17 to outside of the trench 17. The p-well layer 25 is disposed on the $n^-$-drift layer 4. The p-well layer 25 is connected to the emitter electrode 14 through the $p^+$-contact layer 8a and the contact hole 22. The contact hole 22 is disposed outside the trench 17 and between the drawing-out wires 9a. Therefore, a depth of the contact hole 22 can be made equal to those of the contact holes 20, 21 (see FIG. 2A) (heights of bottom surfaces of the contact holes 20, 21, 22 can be made equal to each other), and as a result, the emitter electrode 14 can be surely connected to the polysilicon electrode 18, the p-channel layer 6 and the n⁺-emitter layer 7 (see FIG. 2A), and further to the p-well layer 25 through the contact holes 20, 21, 22.

The insulator film 19 which is thicker than the gate insulator film 10 is disposed from the bottom surface as well as the side face of the trench 17 on the p-well layer 25 to the outside of the trench 17. The gate electrode 9 and the drawing-out wire 9a are disposed on the insulator film 19. This improves breakdown voltage (gate breakdown voltage) of the gate electrode 9 that connects the gate electrode 9 to the drawing-out wire 9a by drawing up the gate electrode 9 from the inside of the trench 17 to the outside.

The first feature of the IGBT 100 according to the present invention is that the gate electrode 9 is formed on the sidewall of the wide trench 17 by a sidewall structure. The sidewall structure of the gate electrode 9 is made of polysilicon that is identical to the material of the polysilicon electrode 18. A width Wa of the trench 17 is formed to be wider than a distance Wb between the neighboring trenches 17 (Wa>Wb). By disposing the trench 17 having such a wide width, a floating p-layer can be omitted. In addition, in the conventional structure, the gate electrode 9 is surrounded by the gate insulator film 10. However, in the embodiment, since the gate electrode 9 is surrounded by the gate insulator film 10 and the thick interlayer dielectric film 13, the feedback capacity can be reduced largely. In addition, the polysilicon electrode 18 located at the distance L away from the gate electrode 9 is disposed on the insulator film 19 that has a thickness Tb which is thicker than a thickness Ta of the gate insulator film 10 (Tb>Ta). This is because of the following reason. An overvoltage is generated in the gate insulator film 10 and the thick insulator film 19 at turn-off of IGBT. Since the overvoltage increases as a distance of the gate insulator film 10 or the thick insulator film 19 from the gate electrode 9 becomes larger, the insulator film 19 below the polysilicon electrode 18 away from the gate electrode 9 is formed to be thicker, in order to avoid the breakdown and reliability degradation of the insulator film.

Figure 3:
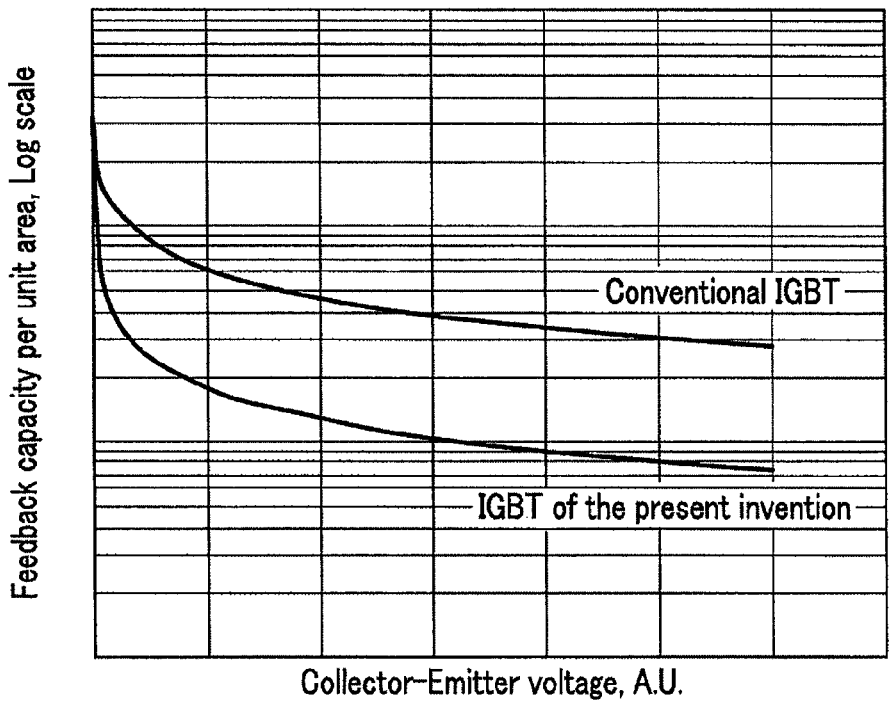
FIG. 3 is a characteristic graph showing a dependency of a feedback capacitor on a collector-emitter voltage per unit area of IGBT according to the present invention.

Calculation results of a dependency of feedback capacitor on a collector-emitter voltage per unit area of the IGBT 100 according to the present invention are shown in FIG. 3. As seen from FIG. 3, the feedback capacity of the IGBT 100 according to the present invention can be reduced to about ¼ in comparison with the conventional IGBT.

The second feature of the IGBT 100 according to the present invention is, as shown in FIG. 2A, that the polysilicon electrode 18 is disposed between the gate electrodes 9 in the wide trench 17. The polysilicon electrode 18 is connected to the emitter electrode 14 and can relax electric field applied to a corner portion 9e of the gate electrode 9 when a voltage is applied, thereby resulting in improvement of the breakdown voltage. In addition, since a capacity is formed by the polysilicon electrode 18 and the insulator film 19, the IGBT 100 is turned-on by the capacity, and a part of hole current fills the capacity when the hole current flows into below the trench 17. As a result, a rise in potential at the bottom portion of the trench 17 is suppressed, thereby resulting in suppression of rise in gate potential.

Figure 4:
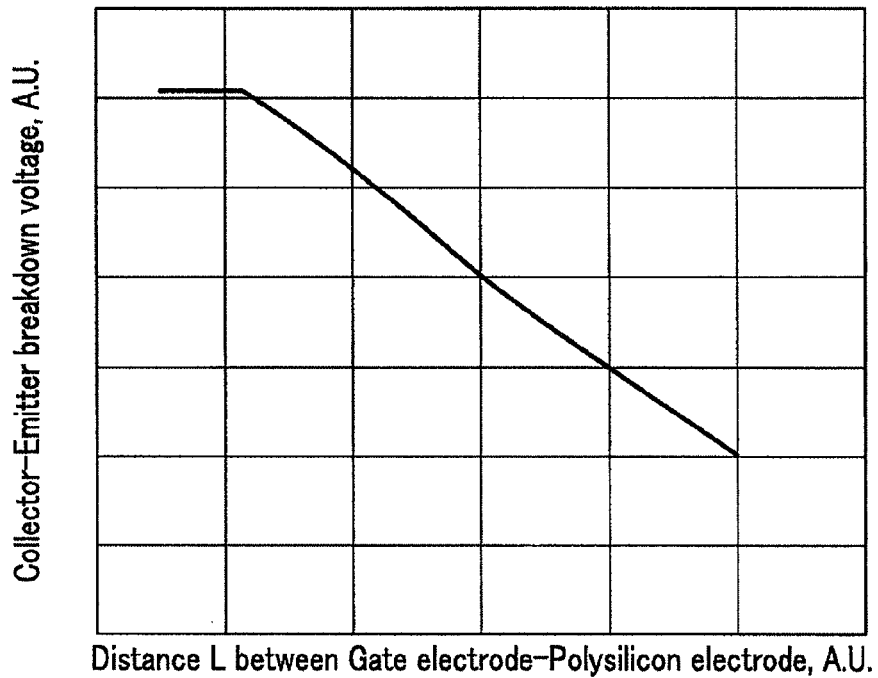
FIG. 4 is a characteristic graph showing a dependency of a collector-emitter breakdown voltage on a distance L between a gate electrode and a polysilicon electrode in IGBT according to the present invention.

A calculation result of a dependency of collector-emitter breakdown voltage on a distance L between the gate electrode 9 and the polysilicon electrode 18 in IGBT according to the present invention is shown in FIG. 4. From FIG. 4, it is known that the breakdown voltage can be improved by moving the gate electrode 9 closer to the polysilicon electrode 18 (shorten the distance L). This is considered that when a voltage is applied, electric field is applied not only to the corner portion 9e of the gate electrode 9, but also to a corner portion 18e of the polysilicon electrode 18, then, the electric field applied to the corner portion 9e of the gate electrode 9 is dispersed to be relaxed, thereby resulting in improvement of the breakdown voltage.

The third feature of the IGBT 100 according to the present invention is that a height of upper surface of the polysilicon electrode 18 is set to be identical to heights of upper surfaces of the p-channel layer 6 (p⁺-contact layer 8), the n⁺-emitter layer 7 and p-well layer 25 (p⁺-contact layer 8a). This can relax a step difference between the inside and the outside of the wide trench 17. If the step difference is large, for example, a uneven resist may be caused in photo-process and a reliability degradation in wire-bonding may be caused, in the fabrication. However, in the IGBT 100 according to the present invention, since the step difference can be relaxed, the foregoing problems can be avoided.

Figure 5:
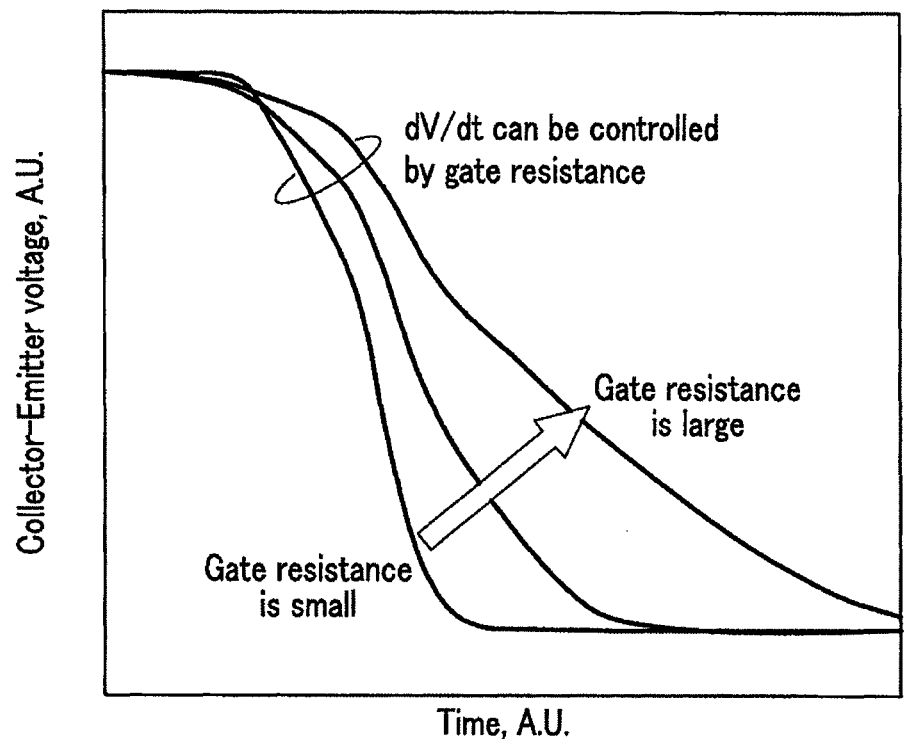
FIG. 5 is a characteristic graph showing a calculated waveform of a collector-emitter voltage at turn-on of IGBT according to the present invention.

A calculated waveform of a collector-emitter voltage at turn-on of the IGBT 100 according to the present invention is shown in FIG. 5. From FIG. 5, it is known that dVce/dt of the collector-emitter voltage can be controlled by varying the gate resistance, according to the IGBT 100 of the present invention.

As described above, in the IGBT 100 according to the present invention, a floating p-layer is omitted by disposing the wide trench 17, and a feedback capacity of the gate is reduced by disposing the gate electrode 9 using the sidewall on the sidewall of the trench 17. As a result, a controllability of dV/dt during the turn-on switching period by a gate drive circuit can be improved. Furthermore, the breakdown voltage can be maintained by disposing the polysilicon electrode 18, which is connected to the emitter electrode 14, between the gate electrodes 9.

Hereinafter, explanation will be given of effects of omission of the floating p-layer in detail. The floating p-layer has been disposed, instead of forming the p-channel layer 6, at an area having a wide interval of a trench gate in a structure that has changed an arrangement pitch of the trench gate (gate electrode 9) of the conventional IGBT. By forming the structure as described above, since current flow only in a portion having a narrow interval of the trench gate, an overcurrent that flows at short-circuiting can be suppressed and a maximum tolerated breakdown voltage was improved. In addition, since apart of hole current flows into the p-channel layer 6 through the floating p-layer, a hole concentration around the trench gate increases and the on-voltage can be reduced. Furthermore, a p-n junction formed by the floating p-layer and the n⁻-drift layer 4 relaxes an electric field applied to the trench gate, and as a result, the breakdown voltage was maintained high. However, a controllability of time derivative dV/dt of output voltage during the turn-on switching period of IGBT decreases, and dV/dt (dVce/dt) was not changed and not controlled even if the gate resistance was varied, specifically, in the first half of the turn-on switching period.

The reason of decrease in the controllability is considered as follows. Namely, when IGBT is switched to on-state, holes transiently flow into the floating p-layer, and a potential of the floating p-layer become high. In this case, a displacement current flows in the gate electrode 9 through a feedback capacity formed by the gate insulator film 10, and since a gate potential is raised, a time derivative dIc/dt of collector current that is determined by a product of a mutual conductance gm of a MOSFET structure and a time derivative dVge/dt of a gate-emitter voltage increases, and as a result, a switching speed is accelerated. An amount of holes transiently flowing into the floating p-layer is mainly determined by an internal structure of the semiconductor device and is difficult to control the amount by an external gate resistance. Therefore, the accelerated dIc/dt can not be controlled by the external gate resistance, and as a result, a period where the time derivative dVce/dt of the collector-emitter voltage can not be controlled by a gate resistance, is generated.

In order to suppress a rise in gate potential by the effect of the floating p-layer, in the present invention, the floating p-layer is omitted, and the interlayer dielectric film 13 is filled instead of forming the floating p-layer, and furthermore, the polysilicon electrode 18 connected to the emitter electrode 14 is embedded in the interlayer dielectric film 13. Since a potential fluctuation of the gate by the effect of the floating p-layer is eliminated by omitting the floating p-layer, the controllability of dV/dt can be improved. In addition, since a rise in potential of the polysilicon electrode 18 is suppressed by electrically connecting the polysilicon electrode 18 and the emitter electrode 14 through the resistance R1, the displacement current flowing into the gate electrode 9 from the floating p-layer can be reduced. Therefore, a rise in gate potential is suppressed, and thereby, the controllability of dV/dt can be improved. In addition, since the polysilicon of the gate electrode 9 is covered by a thick insulator film (interlayer dielectric film 13), a feedback capacity can be reduced, and as a result, the controllability of dV/dt can be further improved.

(Fabrication Method of Semiconductor Device)

One example of fabrication processes of the IGBT 100 according to the present invention is shown in FIG. 6A to FIG. 6K. Each a of FIG. 6A to FIG. 6K corresponds to a cross sectional view of FIG. 1 taken along A-A line (main functional area). Each b of FIG. 6A to FIG. 6K corresponds to a cross sectional view of FIG. 1 taken along B-B line (terminal structure area). A fabrication method of a semiconductor device according to the embodiments of the present invention is not specifically limited and the conventional method may be used, as long as a structure of the semiconductor device according to the present invention can be finally fabricated.

In the description below, an explanation will be given of the fabrication method of the semiconductor device according to the present invention using one example. With respect to a process of no explanation, the conventional method may be used for the process.

Figure 6A:
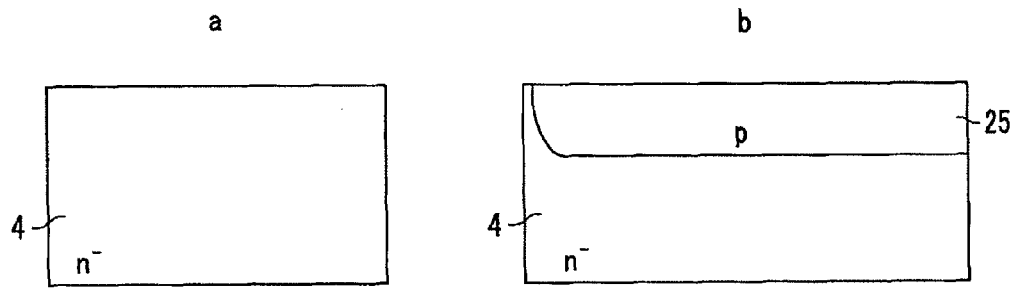
FIG. 6A are cross sectional views showing a fabrication process (First) of IGBT according to the present invention, and a corresponds to a cross sectional view taken along A-A line of FIG. 1 and b corresponds to a cross sectional view taken along B-B line of FIG. 1.

First, as shown in a and b of FIG. 6A, a semiconductor substrate to be the n⁻-drift layer 4 is prepared. Then, as shown in b of FIG. 6A, the p-well layer 25 is formed on the upper side of the n⁻-drift layer 4.

Figure 6B:
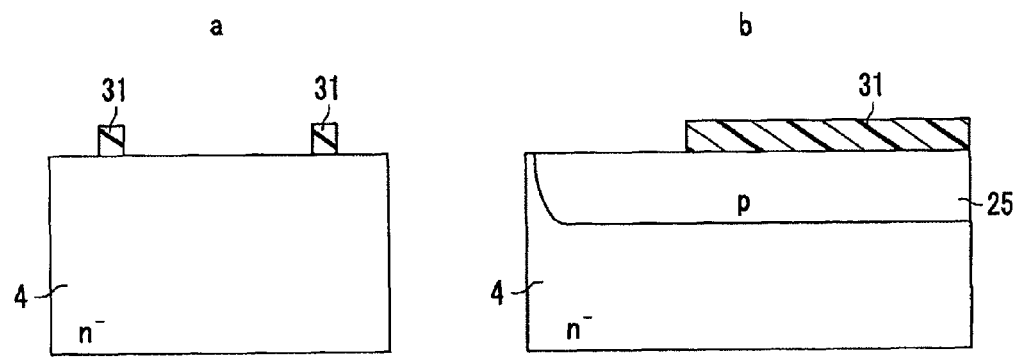
FIG. 6B are cross sectional views showing a fabrication process (Second) of IGBT according to the present invention, and a corresponds to a cross sectional view taken along A-A line of FIG. 1 and b corresponds to a cross sectional view taken along B-B line of FIG. 1.

Next, as shown in a and b of FIG. 6B, a photoresist 31 is patterned in a shape of the trench 17 on the n⁻-drift layer 4 and the p-well layer 25.

Figure 6C:
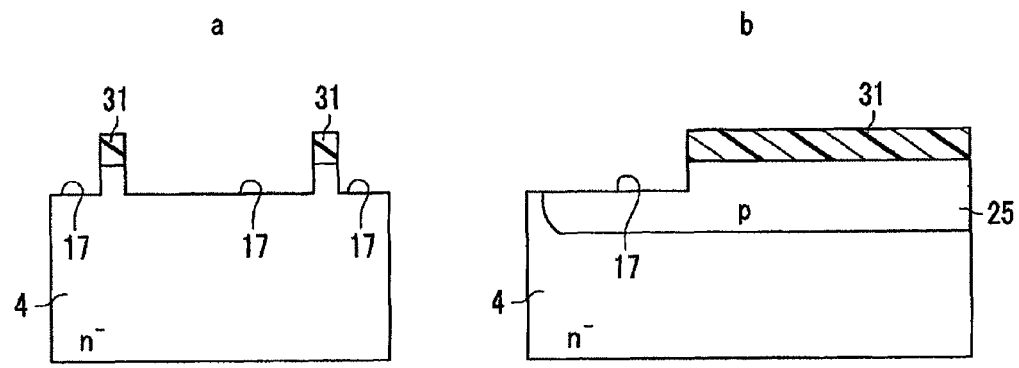
FIG. 6C are cross sectional views showing a fabrication process (Third) of IGBT according to the present invention, and a corresponds to a cross sectional view taken along A-A line of FIG. 1 and b corresponds to a cross sectional view taken along B-B line of FIG. 1.

Next, as shown in a and b of FIG. 6C, anisotropic etching is conducted using the photoresist 31 as a mask to form the wide trench 17. The trench 17 is formed to be shallower than the bottom surface of the p-well layer 25.

Figure 6D:
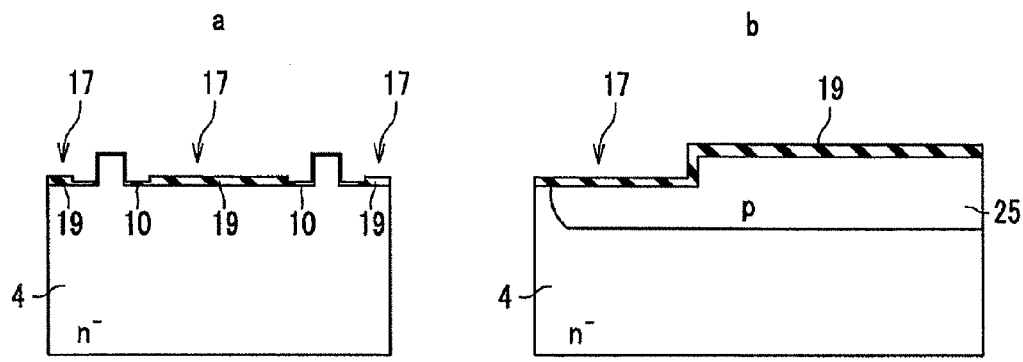
FIG. 6D are cross sectional views showing a fabrication process (Fourth) of IGBT according to the present invention, and a corresponds to a cross sectional view taken along A-A line of FIG. 1 and b corresponds to a cross sectional view taken along B-B line of FIG. 1.

Next, as shown in a and b of FIG. 6D, the gate insulator film 10 and the insulator film 19 which is thicker than the gate insulator film 10 are formed. Meanwhile, the gate insulator film 10 is prepared as follows. First, the insulator film 19 is formed on the entire surface, and subsequently, an area of the insulator film 19 corresponding to the area of the gate insulator film 10 is anisotropically etched in order to prepare the gate insulator film 10, using photolithography. In this case, the insulator film 19 may be thinned to prepare the gate insulator film 10 by the etching, or an area of the n⁻-drift layer 4 corresponding to the area of the gate insulator film 10 may be exposed. When the n⁻-drift layer 4 is exposed, the gate insulator film 10 may be formed by thermally oxidizing the n⁻-drift layer 4.

Figure 6E:
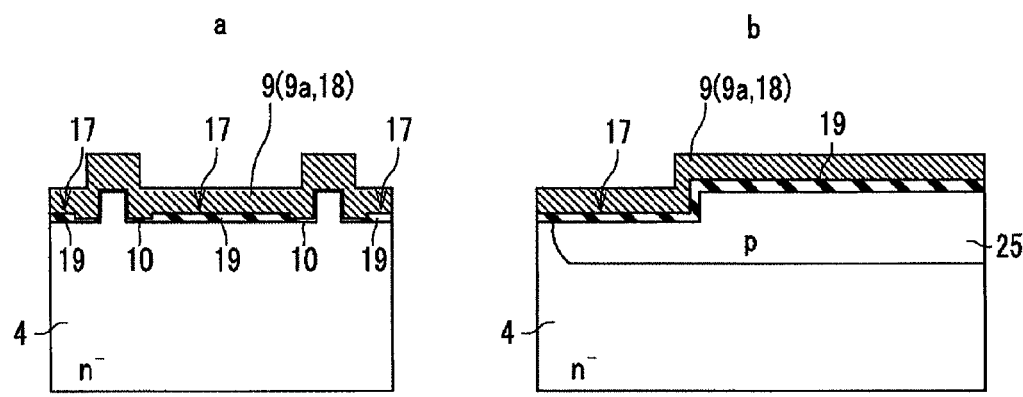
FIG. 6E are cross sectional views showing a fabrication process (Fifth) of IGBT according to the present invention, and a corresponds to a cross sectional view taken along A-A line of FIG. 1 and b corresponds to a cross sectional view taken along B-B line of FIG. 1.

Next, as shown in a and b of FIG. 6E, a polysilicon film that forms the gate electrode 9, the drawing-out wire 9a and the polysilicon electrode 18 is grown. In this case, a thickness of the growing polysilicon film is adjusted so that a height of the upper surface of the polysilicon grown inside the trench 17 is identical to the height of the upper surface of the n⁻-drift layer 4 outside the trench 17.

Figure 6F:
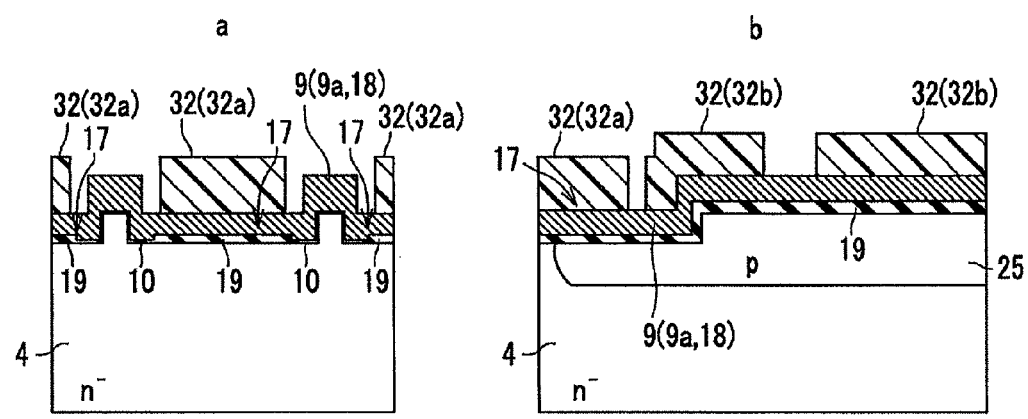
FIG. 6F are cross sectional views showing a fabrication process (Sixth) of IGBT according to the present invention, and a corresponds to a cross sectional view taken along A-A line of FIG. 1 and b corresponds to a cross sectional view taken along B-B line of FIG. 1.

Next, as shown in a and b of FIG. 6F, a photoresist 32 (32a) is patterned in a shape of the polysilicon electrode 18 on the polysilicon film. In addition, as shown in b of FIG. 6F, the photoresist 32 (32b) is patterned in shapes of a part of the gate electrode 9 and the drawing-out wire 9a on the polysilicon film.

Figure 6G:
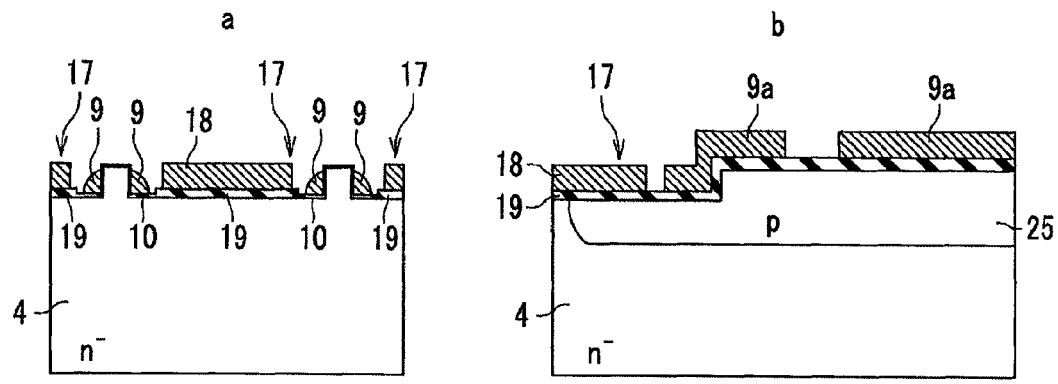
FIG. 6G are cross sectional views showing a fabrication process (Seventh) of IGBT according to the present invention, and a corresponds to a cross sectional view taken along A-A line of FIG. 1 and b corresponds to a cross sectional view taken along B-B line of FIG. 1.

Next, as shown in a and b of FIG. 6G, the polysilicon electrode 18 and the drawing-out wire 9a are formed by conducting anisotropic etching using the photoresist 32 as a mask. At the same time, the gate electrode 9 is also formed as a sidewall.

Figure 6H:
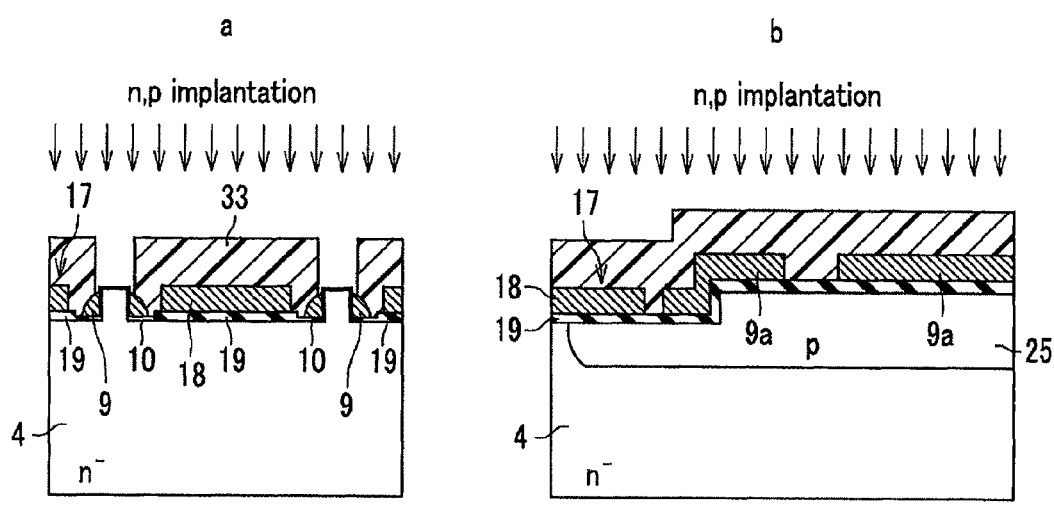
FIG. 6H are cross sectional views showing a fabrication process (Eighth) of IGBT according to the present invention, and a corresponds to a cross sectional view taken along A-A line of FIG. 1 and b corresponds to a cross sectional view taken along B-B line of FIG. 1.

Next, as shown in a and b of FIG. 6H, a photoresist 33 is patterned in a shape of the p-channel layer 6, and ion implantation is conducted so that the p-channel layer 6 becomes p-type semiconductor. In addition, the photoresist 33 is patterned in a shape of the n⁺-emitter layer 7, and ion implantation is conducted so that the n⁺-emitter layer 7 becomes n-type semiconductor.

Figure 6I:
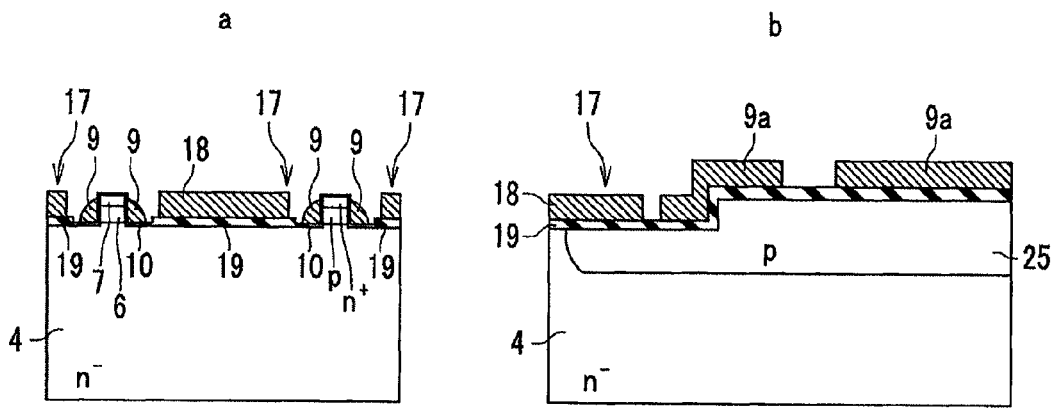
FIG. 6I are cross sectional views showing a fabrication process (Ninth) of IGBT according to the present invention, and a corresponds to a cross sectional view taken along A-A line of FIG. 1 and b corresponds to a cross sectional view taken along B-B line of FIG. 1.

Next, as shown in a and b of FIG. 6I, the p-channel layer 6 and the n⁺-emitter layer 7 are formed by activating the implanted ions by annealing. The p-channel layer 6 and the n⁺-emitter layer 7 are formed between neighboring trenches 17 and on the n⁻-drift layer 4 outside the trench 17.

Figure 6J:
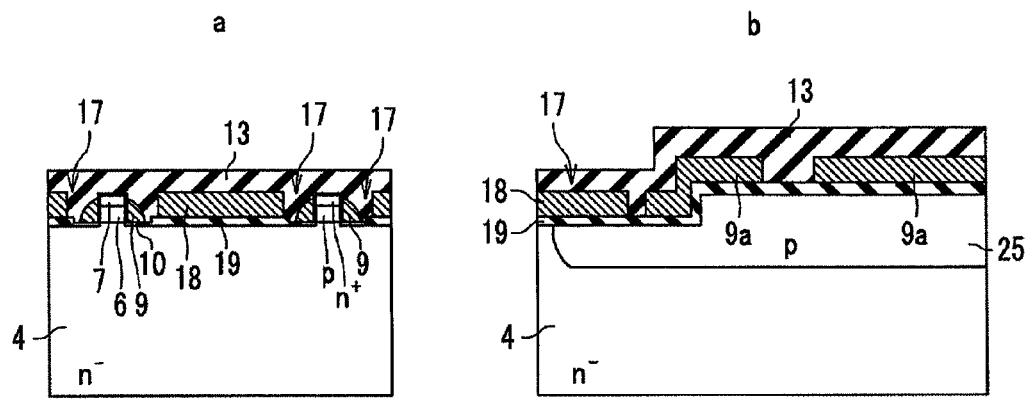
FIG. 6J are cross sectional views showing a fabrication process (Tenth) of IGBT according to the present invention, and a corresponds to a cross sectional view taken along A-A line of FIG. 1 and b corresponds to a cross sectional view taken along B-B line of FIG. 1.

Next, as shown in a and b of FIG. 6J, the interlayer dielectric film 13 is grown on the entire surface. The interlayer dielectric film 13 is grown on the p-channel layer 6 and the n⁺-emitter layer 7, gate electrode 9, the drawing-out wire 9a and the polysilicon electrode 18, as well as between the gate electrode 9 (drawing-out wire 9a) and the polysilicon electrode 18 and the like.

Figure 6K:
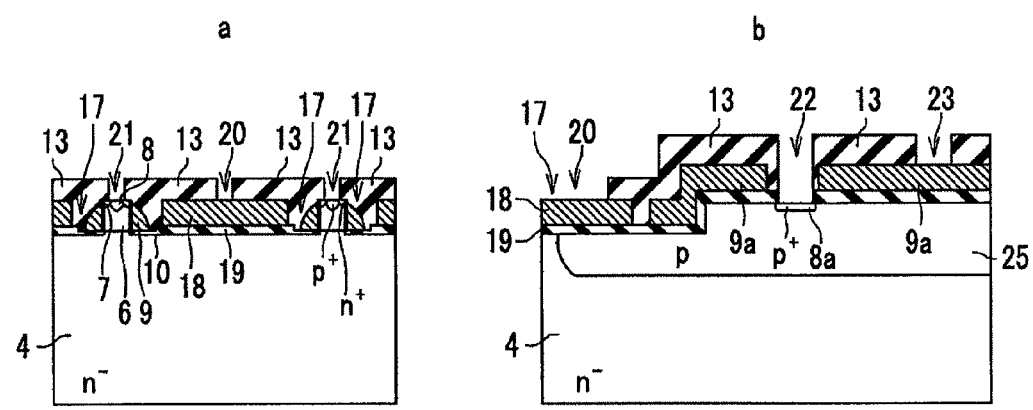
FIG. 6K are cross sectional views showing a fabrication process (Eleventh) of IGBT according to the present invention, and a corresponds to a cross sectional view taken along A-A line of FIG. 1 and b corresponds to a cross sectional view taken along B-B line of FIG. 1.

Next, as shown in a and b of FIG. 6K, the contact holes 20 to 23 are formed in the interlayer dielectric film 13 by photolithography and anisotropic etching. The p⁺-contact layers 8, 8a are formed by ion implantation using the interlayer dielectric film 13, the polysilicon electrode 18 and the drawing-out wire 9a as a mask.

Finally, as shown in FIG. 2A and FIG. 2B, the emitter electrode 14, the drawing-out gate electrode 12, the n-buffer layer 3, the p-collector layer 2 and the collector electrode 11 are formed. Through the foregoing processes, the IGBT 100 is completed. Meanwhile, in the first embodiment, the p-collector layer 2 and the n-buffer layer 3, which are located on the backside, are formed after the processes of the front side. However, for example, an epitaxial substrate where the p-collector layer 2 and the n-buffer layer 3 are formed in advance may be used.

Second Embodiment

Figure 7:
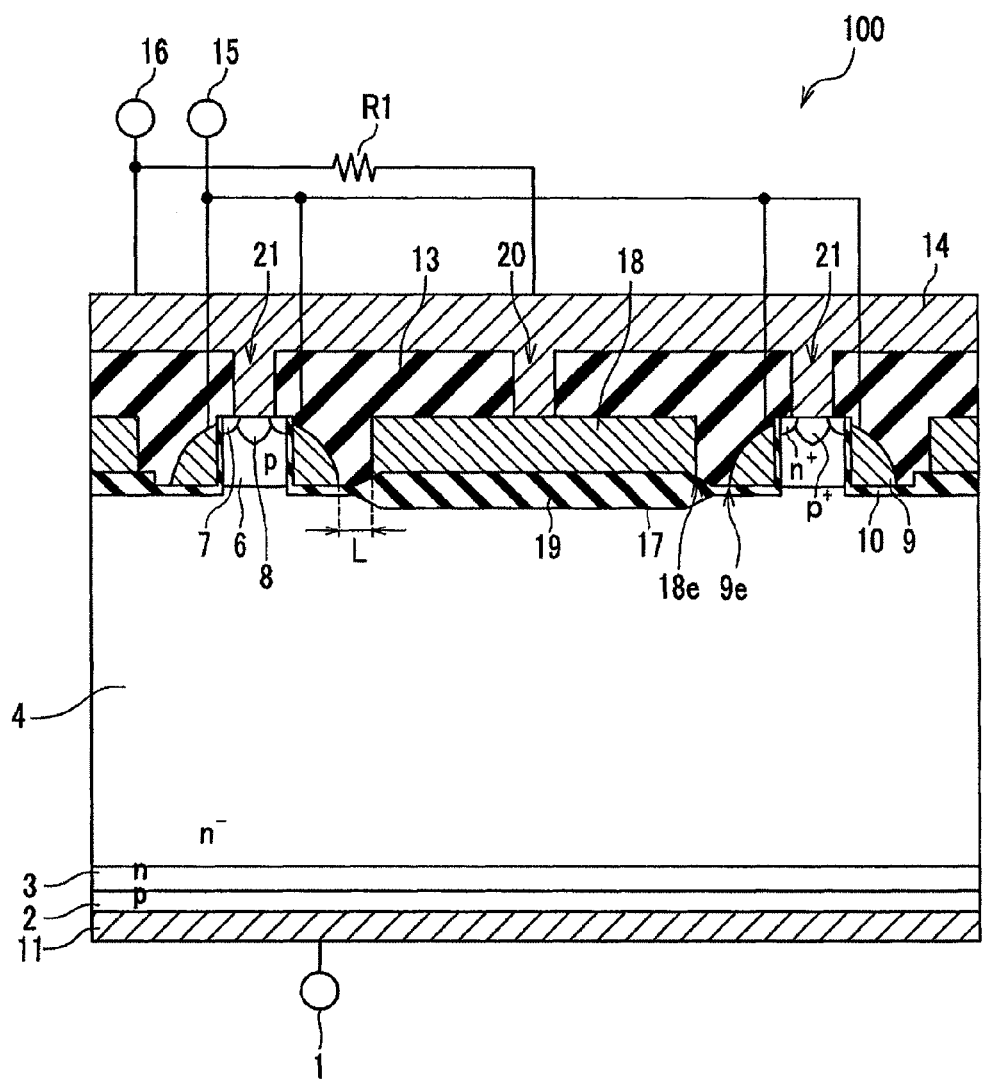
FIG. 7 is a cross sectional view of a main portion of a semiconductor device (IGBT) according to a second embodiment of the present invention, that corresponds to a cross sectional view taken along A-A line of FIG. 1.

A cross sectional view of a main portion of the semiconductor device (IGBT) 100 according to a second embodiment of the present invention is shown in FIG. 7. The cross sectional view of FIG. 7 corresponds to a cross sectional view taken along A-A line of FIG. 1. The second embodiment is identical to the first embodiment except that the insulator film 19, especially, the insulator film 19 formed on the bottom surface of the trench 17 is formed by LOCOS (Local Oxidation of Silicon). Using the LOCOS, when a thickness of the insulator film 19 according to the second embodiment is set to be equal to that of the first embodiment, the bottom surface of the insulator film 19 according to the second embodiment becomes lower than that of the first embodiment, and in addition, the upper surface of the insulator film 19 according to the second embodiment also becomes lower than that of the first embodiment. If the upper surface of the insulator film 19 becomes lower, a height of the corner portion 18e of the polysilicon electrode 18 formed on the upper surface of the insulator film 19 also becomes lower, and the corner portion 18e can be approached to the corner portion 9e of the gate electrode 9. As a result, the distance L shown in FIG. 4 can be actually shortened, thereby resulting in increase in emitter-collector breakdown voltage.

In the insulator film 19 formed by LOCOS, an outer periphery portion of the insulator film 19 becomes thinner toward the outer side by the bird's beak. The upper surface of the outer periphery portion of the insulator film 19 forms a taper surface that becomes lower toward the outer side. The taper surface becomes lower toward the gate electrode 9. In addition, an end face of the polysilicon electrode 18 is disposed on the taper surface. As a result, since the height of the corner portion 18e of the polysilicon electrode 18 can be further lowered, the corner portion 18e can be further approached to the corner portion 9e of the gate electrode 9, thereby resulting in increase in emitter-collector breakdown voltage.

Meanwhile, in the fabrication method of the IGBT 100 according to the second embodiment, the LOCOS may be conducted only on the area where the insulator film 19 is formed, instead of forming the insulator film 19 on the entire surface as the first embodiment. After that, an area (the area where the LOCOS was not conducted) of the n⁻-drift layer 4 where the gate insulator film 10 is to be formed is exposed, and the gate insulator film 10 is formed by thermally oxidizing the n⁻-drift layer 4.

Third Embodiment

Figure 8:
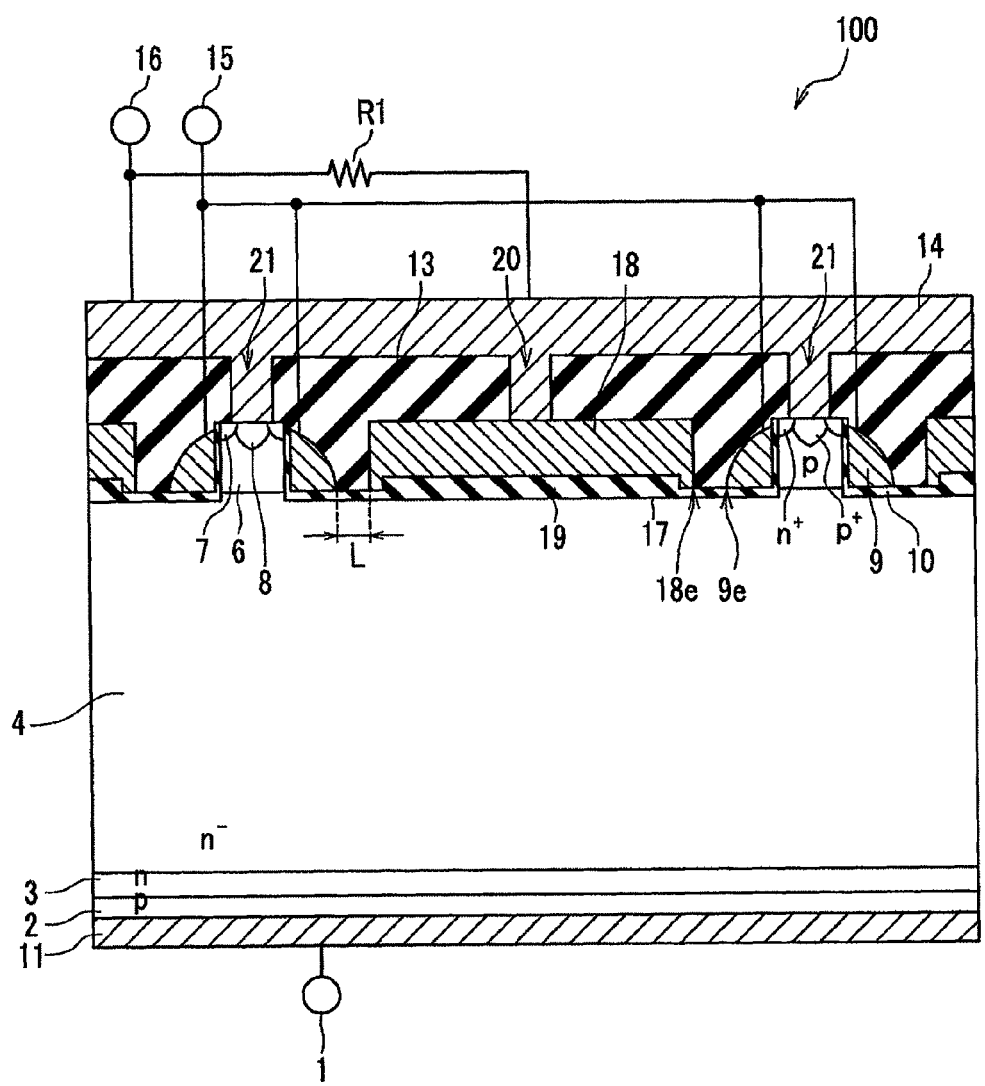
FIG. 8 is a cross sectional view of a main portion of a semiconductor device (IGBT) according to a third embodiment of the present invention, that corresponds to a cross sectional view taken along A-A line of FIG. 1.

A cross sectional view of a main portion of the semiconductor device (IGBT) 100 according to a third embodiment of the present invention is shown in FIG. 8. The cross sectional view of FIG. 8 corresponds to a cross sectional view taken along A-A line of FIG. 1. The third embodiment is identical to the first embodiment except that the polysilicon electrode 18 is disposed not only on the insulator film 19 but also on a part of the gate insulator film 10 at the outer periphery portion of the insulator film 19. A thickness of the gate insulator film 10 at the periphery portion of the polysilicon electrode 18 is identical to the thickness of the gate insulator film 10 at the gate electrode 9. According to this structure, a height of the corner portion 18e of the polysilicon electrode 18 can be made equal to the height of the corner portion 9e of the gate electrode 9, and the corner portion 18e of the polysilicon electrode 18 can be approached to the corner portion 9e of the gate electrode 9. As a result, the distance L shown in FIG. 4 can be actually shortened, thereby resulting in increase in emitter-collector breakdown voltage.

Fourth Embodiment

Figure 9:
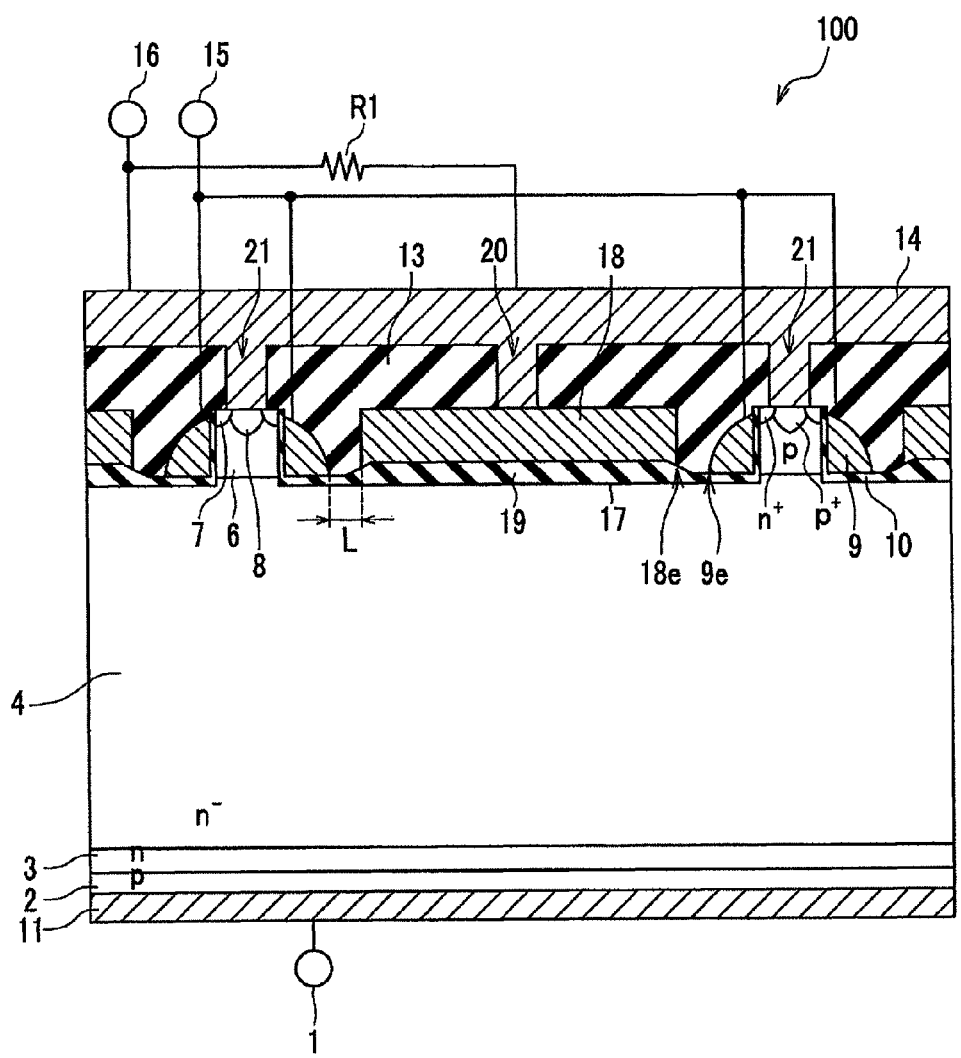
FIG. 9 is a cross sectional view of a main portion of a semiconductor device (IGBT) according to a fourth embodiment of the present invention, that corresponds to a cross sectional view taken along A-A line of FIG. 1.

A cross sectional view of a main portion of the semiconductor device (IGBT) 100 according to a fourth embodiment of the present invention is shown in FIG. 9. The cross sectional view of FIG. 9 corresponds to a cross sectional view taken along A-A line of FIG. 1. The fourth embodiment is identical to the first embodiment except that an outer periphery portion of the insulator film 19 becomes thinner toward the outer side. An upper surface of the periphery portion of the insulator film 19 forms a taper surface that becomes lower toward the outer side. The taper surface becomes lower toward the gate electrode 9 as with the second embodiment. In addition, an end face of the polysilicon electrode 18 is disposed on the taper surface. According to this structure, since the height of the corner portion 18e of the polysilicon electrode 18 can be further lowered, the corner portion 18e can be approached to the corner portion 9e of the gate electrode 9. As a result, the distance L shown in FIG. 4 can be actually shortened, thereby resulting in increase in emitter-collector breakdown voltage.

Meanwhile, in the fabrication method of the IGBT 100 according to the fourth embodiment, first, the insulator film 19 is formed on the entire surface, then, a photoresist is patterned and the insulator film 19 is isotropically etched using the photoresist as a mask, in order to form the taper surface.

Fifth Embodiment

Figure 10:
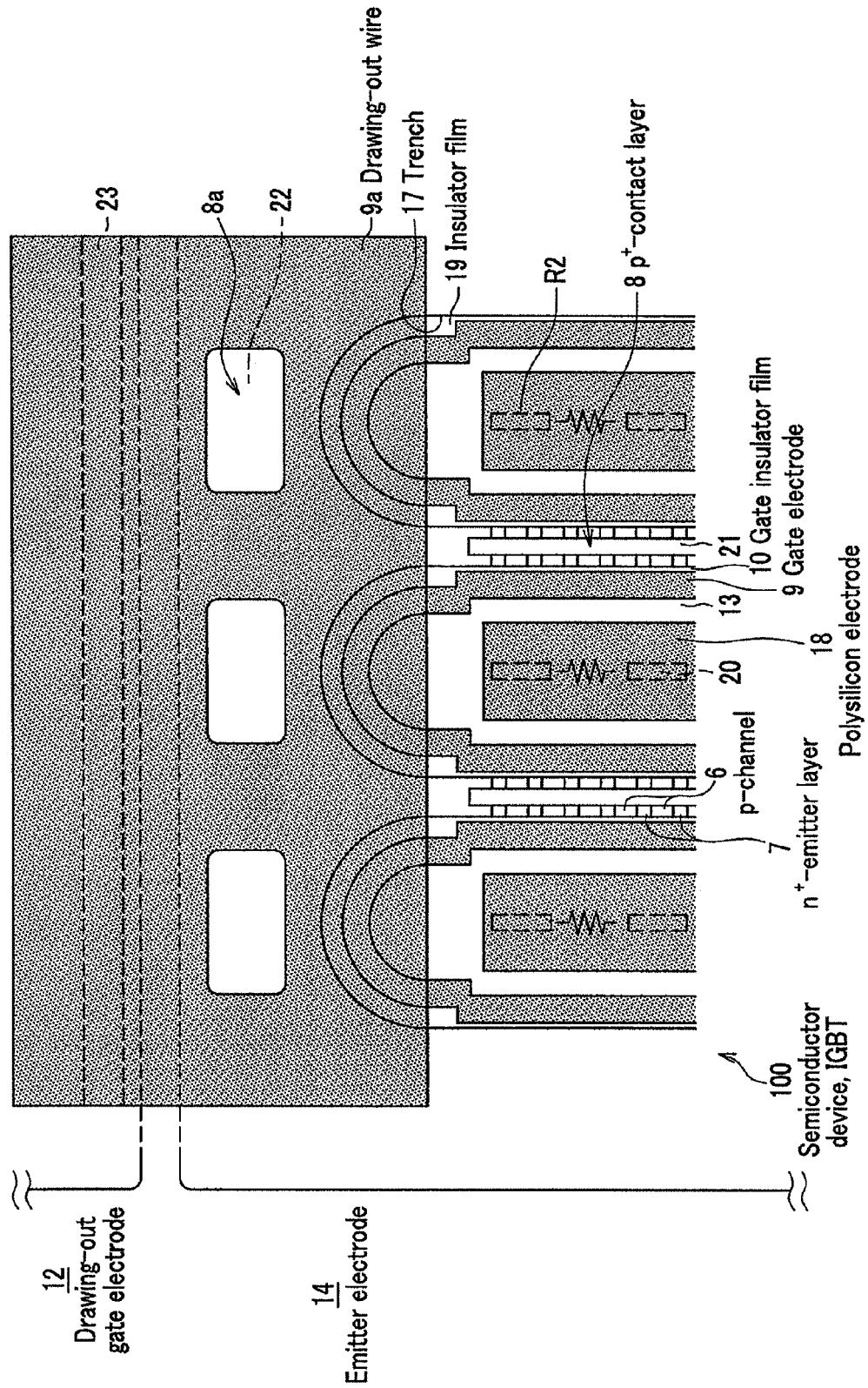
FIG. 10 is a plan view of a main portion of a semiconductor device (IGBT) according to a fifth embodiment of the present invention.

A plan view of a main portion of the semiconductor device (IGBT) 100 according to a fifth embodiment of the present invention is shown in FIG. 10. The fifth embodiment is identical to the first embodiment (see FIG. 2B) except that the contact hole (first contact hole) 20 which is disposed in order to connect the polysilicon electrode 18 and the emitter electrode 14 is discontinuously disposed on the polysilicon electrode 18. On the other hand, in the first embodiment, the contact hole 20 that is disposed in order to connect the polysilicon electrode 18 and the emitter electrode 14 is continuously disposed on the polysilicon electrode 18 like a single groove.

As described above, a rise in potential, just below the trench 17 is suppressed by charging a capacity formed by the polysilicon electrode 18 and the insulator film 19 by a part of hole current, and as a result, a rise in gate potential can be suppressed. However, since the hole current is reduced, the on-voltage increases. Therefore, as shown in FIG. 10, the contact hole 20 is formed discontinuously, in order to increase an internal resistance (resistance) R2 of the polysilicon electrode 18. This is equivalent to that the resistance R2 is connected between the polysilicon electrode 18 and the emitter electrode 14, and set to be larger than the resistance R1 (see FIG. 2A) of the first embodiment. As a result, a suppression effect of rise in gate potential and an increase in on-voltage can be balanced.

Sixth Embodiment

Figure 11:
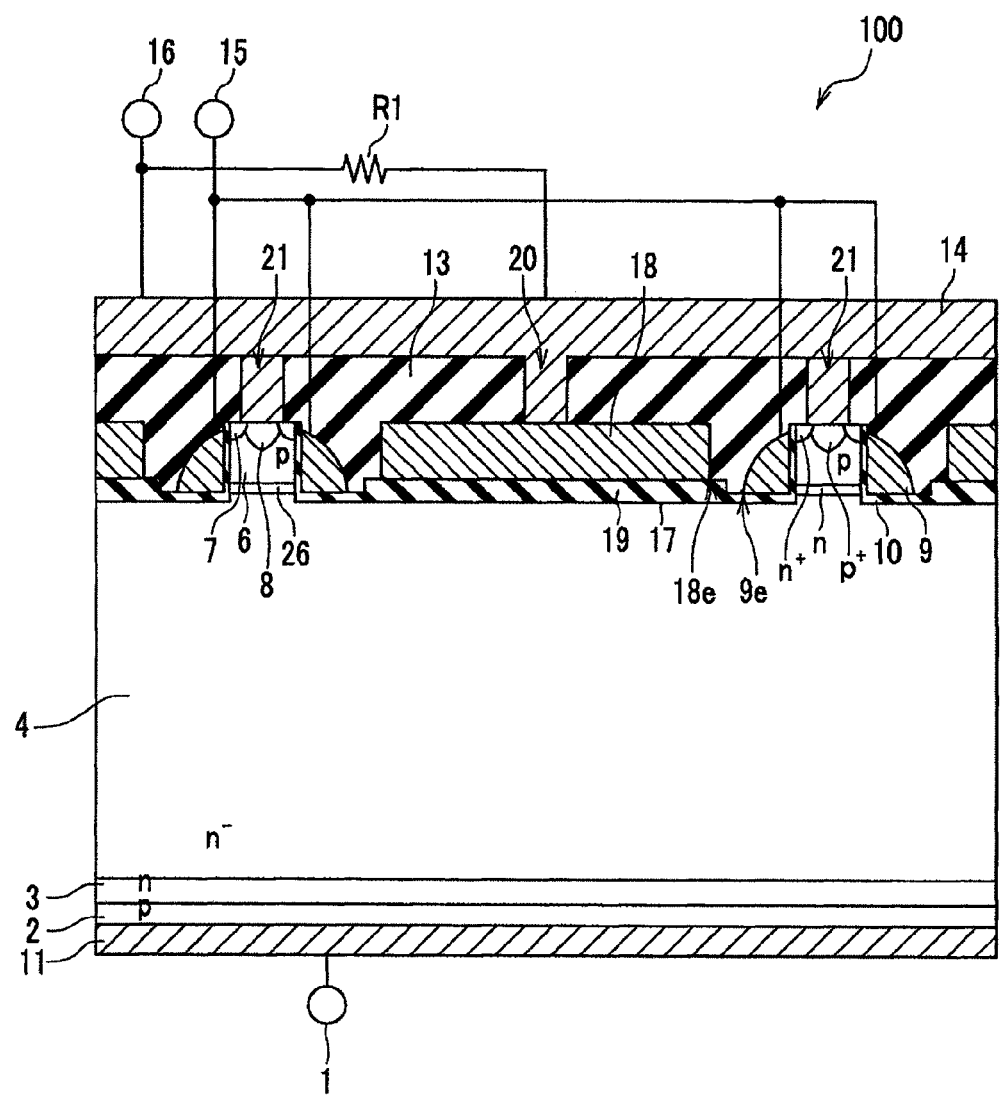
FIG. 11 is a cross sectional view of a main portion of a semiconductor device (IGBT) according to a sixth embodiment of the present invention, that corresponds to a cross sectional view taken along A-A line of FIG. 1.

A cross sectional view of a main portion of the semiconductor device (IGBT) 100 according to a sixth embodiment of the present invention is shown in FIG. 11. The cross sectional view of FIG. 11 corresponds to a cross sectional view of FIG. 1 taken along A-A line. The sixth embodiment is identical to the first embodiment except that an n-layer (sixth semiconductor layer) 26 is disposed between the p-channel layer 6 and the n⁻-drift layer 4. Since the n-layer 26 is inserted below the p-channel layer 6, the n-layer 26 forms a barrier against holes that flow into the emitter electrode 14, and as a result, a hole concentration around the emitter increases, thereby resulting in further reduction of the on-voltage.

Seventh Embodiment

Figure 12:
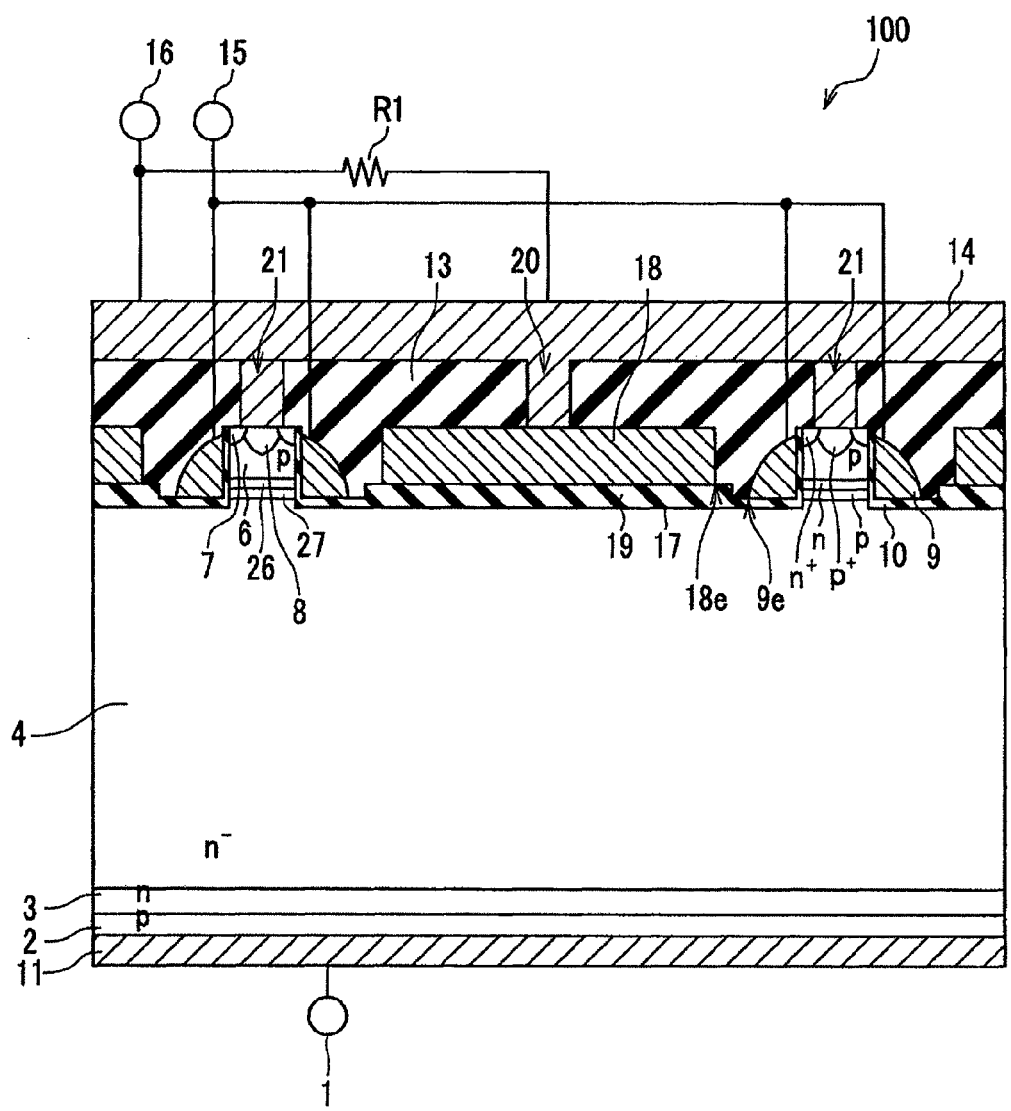
FIG. 12 is a cross sectional view of a main portion of a semiconductor device (IGBT) according to a seventh embodiment of the present invention, that corresponds to a cross sectional view taken along A-A line of FIG. 1.

A cross sectional view of a main portion of the semiconductor device (IGBT) 100 according to a seventh embodiment of the present invention is shown in FIG. 12. The cross sectional view of FIG. 12 corresponds to a cross sectional view of FIG. 1 taken along A-A line of FIG. 1. The seventh embodiment is identical to the sixth embodiment except that a p-layer (seventh semiconductor layer) 27 is disposed between the n-layer 26 and the n⁻-drift layer 4. In the sixth embodiment, the barrier height against the holes becomes higher and the reduction effect of the on-voltage increases as a carrier concentration of the n-layer 26 is increased. However, it is considered that the breakdown voltage decreases due to increase in electric field intensity in the n-layer 26 at off-state. Therefore, by further adding and inserting a p-layer 27 below the n-layer 26, the electric field intensity in the n-layer 26 is relaxed, and as a result, the breakdown voltage can be maintained even if the carrier concentration is increased, thereby resulting in further reduction of the on-voltage.

Eighth Embodiment

Figure 13:
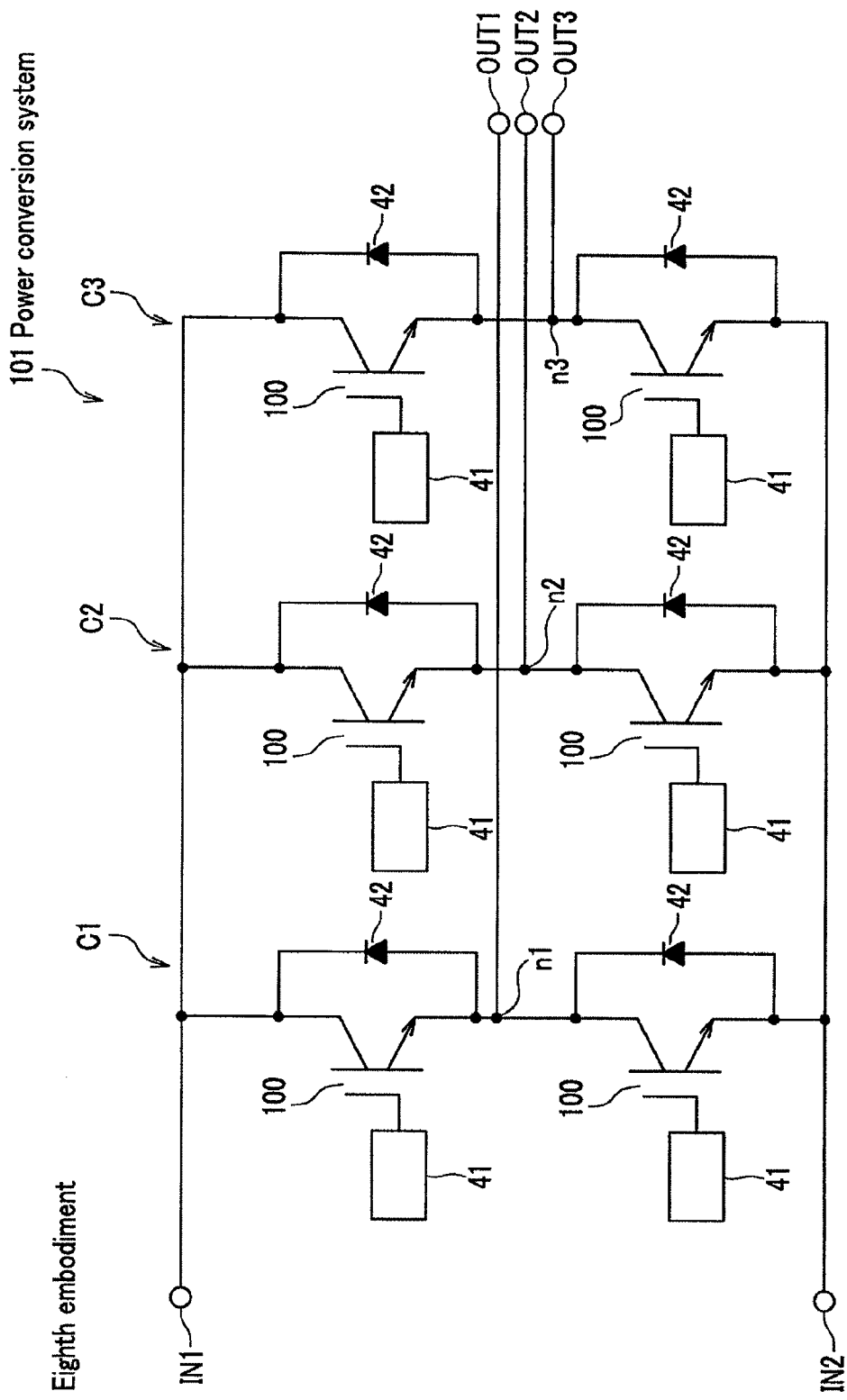
FIG. 13 is a circuit diagram of a power conversion system according to an eighth embodiment of the present invention.

A circuit diagram of a power conversion system 101 according to an eighth embodiment of the present invention is shown in FIG. 13. The power conversion system 101 uses the IGBT (semiconductor device) 100 according to any one of the first to the seventh embodiments. The power conversion system 101 according to the eighth embodiment functions as an inverter. In the power conversion system 101, a plurality (three in FIG. 13) of series-connected circuits C1 to C3, each of which is configured by connecting a plurality (two in FIG. 13) of IGBTs 100 in series, are connected in parallel with each other. Each IGBT 100 is connected to a gate drive circuit 41. Each IGBT 100 is connected to a diode 42 in parallel. Each end of the series-connected circuits C1 to C3 is connected to a pair of input terminals IN1, IN2, respectively. Each of connection points n1 to n3 between the IGBTs 100 in the series-connected circuits C1 to C3 is connected to respective output terminals OUT1 to OUT3. The power conversion system 101 converts electric power inputted from the input terminals IN1, IN2 and outputs the converted electric power from the output terminals OUT1 to OUT3, thereby functions as an inverter. Since the IGBT (semiconductor device) 100 described in any one of the first to the seventh embodiments is used for the power conversion system 101, the power conversion system 101 can achieve a low loss and a high reliability. In the present embodiment, the explanation has been given of the application to the inverter (circuit). However, the IGBT (semiconductor device) 100 according to any one of the first to the seventh embodiments may also be applied to other power conversion systems such as a converter and a chopper, and the same effects can be obtained.

Meanwhile, in the first to the seventh embodiments, the explanation has been given of an n-channel IGBT as an example. However, a semiconductor device of the present invention is not limited to the n-channel IGBT, and a p-channel IGBT is also included in the present invention. In addition, the present invention can be further applied to other device structures having a trench gate.

REFERENCE EXPLANATION

1 Collector terminal
2 p-collector layer (second semiconductor layer)
3 n-buffer layer
4 n⁻-drift layer (first semiconductor layer)
6 p-channel layer (third semiconductor layer)
7 n⁺-emitter layer (fourth semiconductor layer)
8, 8a p⁺-contact layer
9 Gate electrode
9a Drawing-out wire
10 Gate insulator film (second insulator film)
11 Collector electrode (first main electrode)
12 Drawing-out gate electrode
13 Interlayer dielectric film
14 Emitter electrode (second main electrode)
15 Gate terminal
16 Emitter terminal
17 Trench
18 Polysilicon electrode
19 Insulator film (first insulator film)
20 Contact hole (first contact hole)
21 Contact hole
22 Contact hole (second contact hole)
23 Contact hole
25 p-well layer (fifth semiconductor layer)
26 n-layer (sixth semiconductor layer)
27 p-layer (seventh semiconductor layer)
31, 32, 33 Photoresist
41 Gate drive circuit
42 Diode
100 Semiconductor device (IGBT)
101 Power conversion system
C1, C2, C3 Series-connected circuit
IN1, IN2 Input terminal
OUT1, OUT2, OUT3 Output terminal
N1, n2, n3 Connection point
R1, R2 Resistance

What is claimed is:

1. A semiconductor device, comprising:
a first semiconductor layer of a first conductivity type;
a second semiconductor layer of a second conductivity type that is formed near a surface of the first semiconductor layer;
a first main electrode that is electrically connected to the second semiconductor layer;
a third semiconductor layer of the second conductivity type that neighbors the first semiconductor layer and is formed near a surface of the first semiconductor layer opposite to the second semiconductor layer;
a fourth semiconductor layer of the first conductivity type that is selectively disposed in an upper portion of the third semiconductor layer;
a second main electrode that is electrically connected to the third semiconductor layer and the fourth semiconductor layer;
a trench whose side face is in contact with the third semiconductor layer and the fourth semiconductor layer, while reaching the first semiconductor layer;
a gate electrode that is formed by a sidewall of polysilicon along the side face of the trench; and
a polysilicon electrode that is disposed away from the gate electrode within the trench and electrically connected to the second main electrode.

2. The semiconductor device according to claim 1, wherein a width of the trench is wider than a distance between neighboring trenches.

3. The semiconductor device according to claim 2, wherein the polysilicon electrode is electrically connected to the second main electrode through a first contact hole which is discontinuously disposed on the polysilicon electrode.

4. The semiconductor device according to claim 2, wherein at least a part of a first insulator film between the polysilicon electrode and the first semiconductor layer is thicker than a second insulator film between the gate electrode and the first semiconductor layer.

5. The semiconductor device according to claim 4, wherein a thickness of the first insulator film at an outer periphery portion of the polysilicon electrode is equal to a thickness of the second insulator film between the gate electrode and the first semiconductor layer.

6. The semiconductor device according to claim 4, wherein the first insulator film is formed by LOCOS.

7. The semiconductor device according to claim 4, wherein an upper surface of an outer periphery portion of the first insulator film forms a taper surface that lowers toward the gate electrode, and an end face of the polysilicon electrode is disposed on the taper surface.

8. The semiconductor device according to claim 4, further comprising:
a fifth semiconductor layer of the second conductivity type that is disposed on the first semiconductor layer near a terminal structure of the trench,
wherein the first insulator film that is thicker than the second insulator film is disposed between the gate electrode and the fifth semiconductor layer near the terminal structure of the trench.

9. The semiconductor device according to claim 2, wherein a height of an upper surface of the polysilicon electrode is substantially equal to a height of an upper surface of the third semiconductor layer or the fourth semiconductor layer.

10. The semiconductor device according to claim 2, wherein the gate electrode and the polysilicon electrode are formed concurrently by the same process.

11. The semiconductor device according to claim 2, wherein a terminal structure of the trench has substantially a semicircular shape in top view.

12. The semiconductor device according to claim 2, further comprising:
a fifth semiconductor layer of the second conductivity type that is disposed on the first semiconductor layer near a terminal structure of the trench,
wherein the fifth semiconductor layer is electrically connected to the second main electrode through a second contact hole that is disposed on outer side of the terminal structure with respect to the trench.

13. The semiconductor device according to claim 12, wherein the second contact hole is surrounded by a drawing-out wire that draws out the gate electrode outside the trench.

14. The semiconductor device according to claim 2, further comprising:
a sixth semiconductor layer of the first conductivity type that is disposed between the third semiconductor layer and the first semiconductor layer.

15. The semiconductor device according to claim 14, further comprising:
a seventh semiconductor layer of the second conductivity type that is disposed between the sixth semiconductor layer and the first semiconductor layer.

16. A power conversion system, comprising:
a plurality of series-connected circuits that are connected in parallel, each of the series-connected circuits being configured by connecting a plurality of semiconductor devices according to claim 2 in series;
a pair of input terminals that are connected to respective ends of each of the plurality of series-connected circuits; and
output terminals that are connected to respective connection points between the plurality of semiconductor devices within the plurality of series-connected circuits,
wherein an electric power inputted from the pair of input terminals is converted and outputted from the output terminals.

17. The semiconductor device according to claim 1, wherein the polysilicon electrode is electrically connected to the second main electrode through a first contact hole which is discontinuously disposed on the polysilicon electrode.

18. The semiconductor device according to claim 1, wherein at least a part of a first insulator film between the polysilicon electrode and the first semiconductor layer is thicker than a second insulator film between the gate electrode and the first semiconductor layer.

19. The semiconductor device according to claim 18, wherein a thickness of the first insulator film at an outer periphery portion of the polysilicon electrode is equal to a thickness of the second insulator film between the gate electrode and the first semiconductor layer.

20. The semiconductor device according to claim 18, wherein the first insulator film is formed by LOCOS.

21. The semiconductor device according to claim 18, wherein an upper surface of an outer periphery portion of the first insulator film forms a taper surface that lowers toward the gate electrode, and an end face of the polysilicon electrode is disposed on the taper surface.

22. The semiconductor device according to claim 18, further comprising:
a fifth semiconductor layer of the second conductivity type that is disposed on the first semiconductor layer near a terminal structure of the trench,
wherein the first insulator film that is thicker than the second insulator film is disposed between the gate electrode and the fifth semiconductor layer near the terminal structure of the trench.

23. The semiconductor device according to claim 1, wherein a height of an upper surface of the polysilicon electrode is substantially equal to a height of an upper surface of the third semiconductor layer or the fourth semiconductor layer.

24. The semiconductor device according to claim 1, wherein the gate electrode and the polysilicon electrode are formed concurrently by the same process.

25. The semiconductor device according to claim 1, wherein a terminal structure of the trench has substantially a semicircular shape in top view.

26. The semiconductor device according to claim 1, further comprising:
a fifth semiconductor layer of the second conductivity type that is disposed on the first semiconductor layer near a terminal structure of the trench,
wherein the fifth semiconductor layer is electrically connected to the second main electrode through a second contact hole that is disposed on outer side of the terminal structure with respect to the trench.

27. The semiconductor device according to claim 26, wherein the second contact hole is surrounded by a drawing-out wire that draws out the gate electrode outside the trench.

28. The semiconductor device according to claim 1, further comprising:
a sixth semiconductor layer of the first conductivity type that is disposed between the third semiconductor layer and the first semiconductor layer.

29. The semiconductor device according to claim 28, further comprising:
a seventh semiconductor layer of the second conductivity type that is disposed between the sixth semiconductor layer and the first semiconductor layer.

30. A power conversion system, comprising:
a plurality of series-connected circuits that are connected in parallel, each of the series-connected circuits being configured by connecting a plurality of semiconductor devices according to claim 1 in series;
a pair of input terminals that are connected to respective ends of each of the plurality of series-connected circuits; and
output terminals that are connected to respective connection points between the plurality of semiconductor devices within the plurality of series-connected circuits,
wherein an electric power inputted from the pair of input terminals is converted and outputted from the output terminals.

* * * * *